US008971368B1

(12) United States Patent  
Raring et al.

(10) Patent No.: US 8,971,368 B1
(45) Date of Patent: Mar. 3, 2015

(54) LASER DEVICES HAVING A GALLIUM AND NITROGEN CONTAINING SEMIPOLAR SURFACE ORIENTATION

(71) Applicant: Soraa, Inc., Fremont, CA (US)

(72) Inventors: James W. Raring, Fremont, CA (US); Mathew Schmidt, Fremont, CA (US); Bryan Ellis, Fremont, CA (US); Hua Huang, Fremont, CA (US); Melvin McLaurin, Fremont, CA (US); Christiane Poblenz, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 4 days.

(21) Appl. No.: 13/794,410

(22) Filed: Mar. 11, 2013

Related U.S. Application Data

(60) Provisional application No. 61/684,050, filed on Aug. 16, 2012.

(51) Int. Cl.
    H01S 5/00     (2006.01)
    H01S 5/32     (2006.01)
    H01S 5/343    (2006.01)

(52) U.S. Cl.
    CPC .............. *H01S 5/3202* (2013.01); *H01S 5/343* (2013.01)
    USPC .................................... 372/44.011

(58) Field of Classification Search
    CPC ... H01S 5/3201; H01S 5/3202; H01S 5/3216; H01S 5/3219
    USPC .................................... 372/44.011
    See application file for complete search history.

(56) References Cited

U.S. PATENT DOCUMENTS

| 4,065,688 | A  |   | 12/1977 | Thornton |
|-----------|----|---|---------|----------|
| 4,318,058 | A  |   | 3/1982  | Mito et al. |
| 5,334,277 | A  |   | 8/1994  | Nakamura |
| 5,813,753 | A  |   | 9/1998  | Vriens et al. |
| 5,821,555 | A  |   | 10/1998 | Saito et al. |
| 5,982,531 | A  | * | 11/1999 | Emery et al. .................. 359/344 |
| 6,069,394 | A  |   | 5/2000  | Hashimoto et al. |
| 6,153,010 | A  |   | 11/2000 | Kiyoku et al. |
| 6,335,771 | B1 |   | 1/2002  | Hiraishi |
| 6,379,985 | B1 |   | 4/2002  | Cervantes et al. |
| 6,451,157 | B1 |   | 9/2002  | Hubacek |
| 6,498,355 | B1 |   | 12/2002 | Harrah et al. |
| 6,509,651 | B1 |   | 1/2003  | Matsubara et al. |

(Continued)

FOREIGN PATENT DOCUMENTS

| CN | 101009347 | 3/1987 |
| CN | 1538534   | 10/2004 |

(Continued)

OTHER PUBLICATIONS

Cich et al., 'Bulk GaN based violet light-emitting diodes with high efficiency at very high current density', Applied Physics Letters, 101, Nov. 29, 2012, pp. 223509-1-223509-3.

(Continued)

*Primary Examiner* — Yuanda Zhang
(74) *Attorney, Agent, or Firm* — Kilpatrick Townsend & Stockton LLP

(57) ABSTRACT

Laser devices formed on a semipolar surface region of a gallium and nitrogen containing material are disclosed. The laser devices have a laser stripe configured to emit a laser beam having a cross-polarized emission state.

32 Claims, 9 Drawing Sheets

(56) References Cited

U.S. PATENT DOCUMENTS

| | | |
|---|---|---|
| 6,533,874 B1 | 3/2003 | Vaudo et al. |
| 6,639,925 B2 | 10/2003 | Niwa et al. |
| 6,680,959 B2 | 1/2004 | Tanabe et al. |
| 6,809,781 B2 | 10/2004 | Setlur et al. |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 6,956,246 B1 | 10/2005 | Epler et al. |
| 7,012,279 B2 | 3/2006 | Wierer, Jr. et al. |
| 7,053,413 B2 | 5/2006 | D'Evelyn et al. |
| 7,128,849 B2 | 10/2006 | Setlur et al. |
| 7,285,801 B2 | 10/2007 | Eliashevich et al. |
| 7,341,880 B2 | 3/2008 | Erchak et al. |
| 7,358,542 B2 | 4/2008 | Radkov et al. |
| 7,358,543 B2 | 4/2008 | Chua et al. |
| 7,419,281 B2 | 9/2008 | Porchia et al. |
| 7,470,555 B2 | 12/2008 | Matsumura |
| 7,483,468 B2 | 1/2009 | Tanaka |
| 7,555,025 B2 | 6/2009 | Yoshida |
| 7,622,742 B2 | 11/2009 | Kim et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,126,024 B1 | 2/2012 | Raring |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,242,522 B1 | 8/2012 | Raring |
| 8,247,886 B1 | 8/2012 | Sharma et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,293,551 B2 | 10/2012 | Sharma et al. |
| 8,294,179 B1 | 10/2012 | Raring |
| 8,310,143 B2 | 11/2012 | Van De Ven et al. |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,455,894 B1 | 6/2013 | D'Evelyn et al. |
| 2001/0009134 A1 | 7/2001 | Kim et al. |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0070416 A1 | 6/2002 | Morse et al. |
| 2002/0085603 A1 | 7/2002 | Okumura |
| 2002/0105986 A1 | 8/2002 | Yamasaki |
| 2002/0182768 A1 | 12/2002 | Morse et al. |
| 2003/0012243 A1 | 1/2003 | Okumura |
| 2003/0020087 A1 | 1/2003 | Goto et al. |
| 2003/0047076 A1 | 3/2003 | Liu |
| 2003/0140846 A1 | 7/2003 | Biwa et al. |
| 2003/0164507 A1 | 9/2003 | Edmond et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0146264 A1 | 7/2004 | Auner et al. |
| 2004/0151222 A1 | 8/2004 | Sekine |
| 2004/0161222 A1 | 8/2004 | Niida et al. |
| 2004/0207998 A1 | 10/2004 | Suehiro et al. |
| 2004/0247275 A1 | 12/2004 | Vakhshoori et al. |
| 2004/0251471 A1 | 12/2004 | Dwilinski et al. |
| 2005/0040384 A1 | 2/2005 | Tanaka et al. |
| 2005/0072986 A1 | 4/2005 | Sasaoka |
| 2005/0087753 A1 | 4/2005 | D'Evelyn et al. |
| 2005/0121679 A1 | 6/2005 | Nagahama et al. |
| 2005/0167680 A1 | 8/2005 | Shei et al. |
| 2005/0168564 A1 | 8/2005 | Kawaguchi et al. |
| 2005/0199899 A1 | 9/2005 | Lin et al. |
| 2005/0214992 A1 | 9/2005 | Chakraborty et al. |
| 2005/0218413 A1 | 10/2005 | Matsumoto et al. |
| 2005/0218780 A1 | 10/2005 | Chen |
| 2005/0224826 A1 | 10/2005 | Keuper et al. |
| 2005/0224830 A1 | 10/2005 | Blonder et al. |
| 2005/0230701 A1 | 10/2005 | Huang |
| 2005/0263791 A1 | 12/2005 | Yanagihara et al. |
| 2005/0286591 A1 | 12/2005 | Lee |
| 2006/0038542 A1 | 2/2006 | Park et al. |
| 2006/0060872 A1 | 3/2006 | Edmond et al. |
| 2006/0078022 A1 | 4/2006 | Kozaki et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0189098 A1 | 8/2006 | Edmond |
| 2006/0193359 A1 | 8/2006 | Kuramoto |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2006/0273339 A1 | 12/2006 | Steigerwald et al. |
| 2006/0288928 A1 | 12/2006 | Eom et al. |
| 2007/0045200 A1 | 3/2007 | Moon et al. |
| 2007/0081857 A1 | 4/2007 | Yoon |
| 2007/0096239 A1 | 5/2007 | Cao et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0163490 A1 | 7/2007 | Habel et al. |
| 2007/0184637 A1 | 8/2007 | Haskell et al. |
| 2007/0202624 A1 | 8/2007 | Yoon et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0073660 A1 | 3/2008 | Ohno et al. |
| 2008/0083929 A1 | 4/2008 | Fan et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0124817 A1 | 5/2008 | Bour et al. |
| 2008/0128752 A1 | 6/2008 | Wu |
| 2008/0173735 A1 | 7/2008 | Mitrovic et al. |
| 2008/0179607 A1 | 7/2008 | DenBaars et al. |
| 2008/0191223 A1 | 8/2008 | Nakamura et al. |
| 2008/0194054 A1 | 8/2008 | Lin et al. |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0232416 A1 | 9/2008 | Okamoto et al. |
| 2008/0272463 A1 | 11/2008 | Butcher et al. |
| 2008/0282978 A1 | 11/2008 | Butcher et al. |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |

(56) References Cited

U.S. PATENT DOCUMENTS

| | | |
|---|---|---|
| 2008/0315179 A1 | 12/2008 | Kim et al. |
| 2009/0058532 A1 | 3/2009 | Kikkawa et al. |
| 2009/0061857 A1 | 3/2009 | Kazmi |
| 2009/0065798 A1 | 3/2009 | Masui et al. |
| 2009/0078944 A1 | 3/2009 | Kubota et al. |
| 2009/0078955 A1 | 3/2009 | Fan et al. |
| 2009/0080857 A1 | 3/2009 | St. John-Larkin |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0141765 A1 | 6/2009 | Kohda et al. |
| 2009/0146170 A1 | 6/2009 | Zhong et al. |
| 2009/0159869 A1 | 6/2009 | Ponce et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0267098 A1 | 10/2009 | Choi |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0315480 A1 | 12/2009 | Yan et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0032691 A1 | 2/2010 | Kim |
| 2010/0055819 A1 | 3/2010 | Ohba et al. |
| 2010/0096615 A1 | 4/2010 | Okamoto et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117118 A1 | 5/2010 | Dabiran et al. |
| 2010/0140745 A1 | 6/2010 | Khan et al. |
| 2010/0276663 A1 | 11/2010 | Enya et al. |
| 2010/0290208 A1 | 11/2010 | Pickard |
| 2010/0295054 A1 | 11/2010 | Okamoto et al. |
| 2010/0295088 A1 | 11/2010 | D'Evelyn et al. |
| 2010/0309943 A1 | 12/2010 | Chakraborty et al. |
| 2010/0316075 A1 | 12/2010 | Raring et al. |
| 2011/0017298 A1 | 1/2011 | Lee |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0103418 A1 | 5/2011 | Hardy et al. |
| 2011/0108081 A1 | 5/2011 | Werthen et al. |
| 2011/0164637 A1 | 7/2011 | Yoshizumi et al. |
| 2011/0175200 A1 | 7/2011 | Yoshida |
| 2011/0182056 A1 | 7/2011 | Trottier et al. |
| 2011/0186874 A1 | 8/2011 | Shum |
| 2011/0216795 A1 | 9/2011 | Hsu et al. |
| 2011/0279054 A1 | 11/2011 | Katona et al. |
| 2011/0286484 A1 | 11/2011 | Raring et al. |
| 2012/0007102 A1 | 1/2012 | Feezell et al. |
| 2012/0104359 A1 | 5/2012 | Felker et al. |
| 2012/0135553 A1 | 5/2012 | Felker et al. |
| 2012/0187412 A1 | 7/2012 | D'Evelyn et al. |
| 2012/0199841 A1 | 8/2012 | Batres et al. |
| 2012/0288974 A1 | 11/2012 | Sharma et al. |
| 2013/0022758 A1 | 1/2013 | Trottier |
| 2013/0026483 A1 | 1/2013 | Sharma et al. |
| 2013/0044782 A1 | 2/2013 | Raring |
| 2013/0075770 A1 | 3/2013 | Chakraborty et al. |

FOREIGN PATENT DOCUMENTS

| | | |
|---|---|---|
| CN | 1702836 | 11/2005 |
| CN | 1781195 | 5/2006 |
| CN | 101079463 | 11/2007 |
| CN | 101099245 | 1/2008 |
| CN | 101171692 | 4/2008 |
| WO | WO 2004/084275 | 9/2004 |
| WO | WO 2008/041521 | 4/2008 |

OTHER PUBLICATIONS

Franssila, 'Tools for CVD and Epitaxy', Introduction to Microfabrication, 2004, pp. 329-336.

Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.

Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.

Communication from the Korean Patent Office re 10-2012-7009980, dated Apr. 15, 2013.

USPTO Office Action for U.S. Appl. No. 12/481,543 dated Jun. 27, 2011.

USPTO Office Action for U.S. Appl. No. 12/482,440 dated Feb. 23, 2011.

USPTO Office Action for U.S. Appl. No. 12/482,440 dated Aug. 12, 2011.

USPTO Office Action for U.S. Appl. No. 12/484,924 dated Apr. 14, 2011.

USPTO Office Action for U.S. Appl. No. 12/484,924 dated Oct. 31, 2011.

USPTO Office Action for U.S. Appl. No. 12/569,841 dated Dec. 23, 2011.

USPTO Office Action for U.S. Appl. No. 12/569,841 dated Mar. 26, 2013.

USPTO Office Action for U.S. Appl. No. 12/569,844 dated Oct. 12, 2012.

USPTO Notice of Allowance for U.S. Appl. No. 12/569,844 dated Mar. 7, 2013.

USPTO Office Action for U.S. Appl. No. 12/573,820 dated Mar. 2, 2011.

USPTO Office Action for U.S. Appl. No. 12/573,820 dated Oct. 11, 2011.

USPTO Office Action for U.S. Appl. No. 12/634,665 dated Mar. 12, 2012.

USPTO Notice of Allowance for U.S. Appl. No. 12/720,593 dated Jul. 11, 2012.

USPTO Office Action for U.S. Appl. No. 12/727,148 dated May 15, 2013.

USPTO Office Action for U.S. Appl. No. 12/749,466 dated Jul. 3, 2012.

USPTO Office Action for U.S. Appl. No. 12/749,476 dated Apr. 11, 2011.

USPTO Office Action for U.S. Appl. No. 12/749,476 dated Nov. 8, 2011.

USPTO Notice of Allowance for U.S. Appl. No. 12/749,476 dated May 4, 2012.

USPTO Notice of Allowance for U.S. Appl. No. 12/749,476 dated Jun. 26, 2012.

USPTO Office Action for U.S. Appl. No. 12/859,153 dated Sep. 25, 2012.

USPTO Office Action for U.S. Appl. No. 12/859,153 dated Feb. 26, 2013.

USPTO Office Action for U.S. Appl. No. 12/861,765 dated Jul. 2, 2012.

USPTO Office Action for U.S. Appl. No. 12/861,765 dated Mar. 7, 2013.

USPTO Office Action for U.S. Appl. No. 12/879,784 dated Jan. 25, 2012.

USPTO Notice of Allowance for U.S. Appl. No. 12/879,784 dated Apr. 3, 2012.

USPTO Office Action for U.S. Appl. No. 12/936,238 dated Aug. 30, 2012.

USPTO Office Action for U.S. Appl. No. 12/936,238 dated Jan. 30, 2013.

USPTO Notice of Allowance for U.S. Appl. No. 12/936,238 dated Apr. 16, 2013.

USPTO Office Action for U.S. Appl. No. 13/014,622 dated Nov. 28, 2011.

(56) References Cited

OTHER PUBLICATIONS

USPTO Office Action for U.S. Appl. No. 13/014,622 dated Apr. 30, 2012.
USPTO Office Action for U.S. Appl. No. 13/019,897 dated Mar. 30, 2012.
USPTO Office Action for U.S. Appl. No. 13/019,897 dated Jan. 16, 2013.
USPTO Office Action for U.S. Appl. No. 13/025,833 dated Jul. 12, 2012.
USPTO Notice of Allowance for U.S. Appl. No. 13/163,482 dated Jul. 31, 2012.
USPTO Office Action for U.S. Appl. No. 13/179,346 dated Aug. 17, 2012.
USPTO Office Action for U.S. Appl. No. 13/179,346 dated Dec. 13, 2012.
USPTO Office Action for U.S. Appl. No. 13/328,978 dated May 15, 2013.
USPTO Office Action for U.S. Appl. No. 13/465,976 dated Aug. 16, 2012.
USPTO Office Action for U.S. Appl. No. 13/465,976 dated Dec. 20, 2012.
Abare, 'Cleaved and Etched Facet Nitride Laser Diodes', IEEE Journal of Selected Topics in Quantum Electronics, vol. 4, No. 3, May/Jun. 1998, pp. 505-509.
Adesida et al., 'Characteristics of chemically assisted ion beam etching of gallium nitride', Applied Physics Letters, vol. 65, No. 7, 1994, pp. 889-891.
Behfar et al., 'Progress in Etched Facet Technology for GaN and Blue Lasers', Proc. of SPIE., vol. 6473, 64731F, 2007, pp. 1-8.
Feezell et al. 'Development of nonpolar and semipolar InGaN/GaN visible light-emitting diodes', MRS Bulletin, vol. 34, May 2009, pp. 318-323.
Khan et al., 'Cleaved Cavity Optically Pumped InGaN-GaN Laser Grown on Spinel Substrates', Applied Physics Letters, vol. 69, No. 16, Oct. 1996, pp. 2417-2420.
Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, pp. 7032-7035.
Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, pp. 072201-1-072201-3.
Park, 'Crystal Orientation Effects on Electronic Properties of Wurtzite InGaN/GaN Quantum Wells', Journal of Applied Physics, vol. 91, No. 12, 2002, pp. 9903-9908.
International Search Report of PCT Application No. PCT/US2010/030939, dated Jun. 16, 2010, 9 pages total.
International Preliminary Report & Written Opinion of PCT Application No. PCT/US2011/037792, dated Dec. 6, 2012, 13 pages total.
Romanov et al., 'Strain-Induced Polarization in Wurtzite III-Nitride Semipolar Layers', Journal of Applied Plysics, vol. 100, 2006, pp. 023522-1 through 023522-10.
Schoedl et al., 'Facet Degradation of GaN Heterostructure Laser Diodes', Journal of Applied Physics, vol. 97, issue 12, 2006, pp. 123102-1-123102-8.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Communication from the Chinese Patent Office re 200980134723.8 dated Jun. 27, 2013, 19 pages.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/502,058 dated Dec. 8, 2010, 15 pages.
USPTO Office Action for U.S. Appl. No. 12/502,058 dated Aug. 19, 2011, 13 pages.
USPTO Notice of Allowance for U.S. Appl. No. 12/502,058 dated Apr. 16, 2012, 10 pages.
USPTO Notice of Allowance for U.S. Appl. No. 12/502,058 dated Jul. 19, 2012, 13 pages.
USPTO Office Action for U.S. Appl. No. 12/534,838 dated May 3, 2011, 12 pages.
USPTO Office Action for U.S. Appl. No. 12/534,838 dated Jan. 13, 2012, 14 pages.
USPTO Office Action for U.S. Appl. No. 12/534,838 dated Mar. 20, 2012, 13 pages.
USPTO Notice of Allowance for U.S. Appl. No. 12/534,838 dated Jun. 8, 2012, 8 pages.
USPTO Office Action for U.S. Appl. No. 12/749,466 dated Jun. 29, 2011, 20 pages.
USPTO Office Action for U.S. Appl. No. 12/749,466 dated Feb. 3, 2012, 16 pages.
USPTO Office Action for U.S. Appl. No. 12/749,466 dated Jul. 3, 2012, 18 pages.
USPTO Notice of Allowance for U.S. Appl. No. 12/749,466 dated Jan. 2, 2013, 8 pages.
USPTO Office Action for U.S. Appl. No. 12/759,273 dated Nov. 21, 2011, 10 pages.
USPTO Office Action for U.S. Appl. No. 12/759,273 dated Jun. 26, 2012, 10 pages.
USPTO Office Action for U.S. Appl. No. 12/762,269 dated Oct. 12, 2011, 12 pages.
USPTO Notice of Allowance for U.S. Appl. No. 12/762,269 dated Apr. 23, 2012, 8 pages.
USPTO Office Action for U.S. Appl. No. 12/762,271 dated Dec. 23, 2011, 12 pages.
USPTO Office Action for U.S. Appl. No. 12/762,271 dated Jun. 6, 2012, 13 pages.
USPTO Notice of Allowance for U.S. Appl. No. 12/762,271 dated Aug. 8, 2012, 9 pages.
USPTO Notice of Allowance for U.S. Appl. No. 12/762,278 dated Nov. 7, 2011, 11 pages.
USPTO Office Action for U.S. Appl. No. 12/778,718 dated Nov. 25, 2011, 12 pages.
USPTO Notice of Allowance for U.S. Appl. No. 12/778,718 dated Apr. 3, 2012, 14 pages.
USPTO Notice of Allowance for U.S. Appl. No. 12/778,718 dated Jun. 13, 2012, 7 pages.
USPTO Office Action for U.S. Appl. No. 12/868,441 dated Apr. 30, 2012, 12 pages.
USPTO Office Action for U.S. Appl. No. 12/868,441 dated Dec. 18, 2012, 34 pages.
USPTO Notice of Allowance for U.S. Appl. No. 12/868,441 dated Sep. 18, 2013, 13 pages.
USPTO Office Action for U.S. Appl. No. 12/883,093 dated Mar. 13, 2012, 10 pages.
USPTO Office Action for U.S. Appl. No. 12/883,093 dated Aug. 3, 2012, 13 pages.
USPTO Notice of Allowance for U.S. Appl. No. 12/883,093 dated Nov. 21, 2012, 12 pages.
USPTO Office Action for U.S. Appl. No. 12/884,993 dated Mar. 16, 2012, 13 pags.
USPTO Office Action for U.S. Appl. No. 12/884,993 dated Aug. 2, 2012, 15 pages.
USPTO Notice of Allowance for U.S. Appl. No. 12/884,993 dated Nov. 26, 2012, 5 pages.
USPTO Office Action for U.S. Appl. No. 13/114,806 dated Apr. 12, 2013, 22 pages, 22 pages.
USPTO Office Action for U.S. Appl. No. 13/114,806 dated Aug. 26, 2013, 22 pages, 22 pages.
USPTO Office Action for U.S. Appl. No. 13/291,922 dated Feb. 20, 2013, 10 pages.
USPTO Office Action for U.S. Appl. No. 13/291,922 dated Jun. 18, 2013, 9 pages.
USPTO Office Action for U.S. Appl. No. 13/354,639 dated Nov. 7, 2012, 12 pages.
USPTO Notice of Allowance for U.S. Appl. No. 13/354,639 dated Dec. 14, 2012, 8 pages.

* cited by examiner

LASER DEVICES HAVING A GALLIUM AND NITROGEN CONTAINING SEMIPOLAR SURFACE ORIENTATION

This application claims the benefit under 35 U.S.C. §119 (e) of U.S. Provisional Application No. 61/684,050 filed on Aug. 16, 2012, which is incorporated by reference in its entirety.

BACKGROUND

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

SUMMARY

The present invention relates generally to optical techniques. More specifically, the present invention provides methods and devices using semipolar oriented gallium and nitrogen containing substrates for optical applications.

In an example, the present invention provides a laser device. The device includes a gallium and nitrogen containing material having a semipolar surface configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. A laser stripe region is formed overlying a portion of the semipolar surface. The laser stripe region is characterized by a cavity orientation substantially parallel to the projection of the c-direction. The laser stripe region has a first end and a second end. A first facet is provided on the first end of the laser stripe region and a second facet is provided on the second end of the laser stripe region. The device has an n-type cladding region overlying the semipolar surface. The device has an active region comprising at least one active layer region overlying the n-type cladding region. The at least one active region comprises a quantum well region or a double hetero-structure region. A p-type cladding region is overlying the active region. The laser stripe region is characterized by a width configured to emit a laser beam having a selected polarization ratio of a first polarization state and a second polarization state. The polarization ratio between the power emitted in the first polarization state and the power emitted in the second polarization state is greater than 0.9 or the ratio is at least 0.10 and the first polarization state is orthogonal to the second polarization state. In certain embodiments, the emitted laser radiation is linearly polarized, in certain embodiments, circularly polarized, and in certain embodiments, the emitted laser radiation is elliptically polarized. As will be described below, the polarization of the emitted radiation is determined by the birefringent properties of the laser stripe waveguide.

In an example, the present invention provides a laser device. The device includes a gallium and nitrogen containing material having a semipolar surface configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. A laser stripe region is formed overlying a portion of the semipolar surface. The laser stripe region is characterized by a cavity orientation substantially parallel to the projection of the c-direction with a length ranging from 20 µm to 500 µm and a width ranging from 1 µm to 50 µm. The laser stripe region has a first end and a second end. A first facet is provided on the first end of the laser stripe region and a second facet is provided on the second end of the laser stripe region. The device has an n-type cladding region overlying the semipolar surface. The device has an active region comprising at least one active layer region overlying the n-type cladding region. The at least one active region comprises a quantum well region or a double hetero-structure region. A p-type cladding region is overlying the active region. In certain embodiments, the emitted laser radiation is linearly polarized, in certain embodiments, circularly polarized, and in certain embodiments, the emitted laser radiation is elliptically polarized.

In another example, the invention provides a laser device. The device includes a gallium and nitrogen containing substrate having a semipolar surface configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. An array of N single lateral mode stripes is formed overlying the semipolar surface. Each of the single lateral mode laser stripes is characterized by a cavity orientation substantially parallel to the projection of the c-direction and each of the single lateral mode stripes has a length ranging from 20 μm to 500 μm. The device includes a width ranging from about 0.5 μm to about 2.5 μm. The device operates in the single lateral mode for each of the stripes. Each of the single lateral mode stripes emits a laser beam having a first polarization state and a second polarization state. The first polarization state is orthogonal to the second polarization state. The laser device is configured to emit in a substantially polarized state having a primary polarization state and a secondary polarization state wherein the second polarization state is at least less than 15% that of the primary polarization state.

In an alternative example, the invention provides a laser device. The device includes a gallium and nitrogen containing material having a semipolar surface configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The device has a laser stripe region formed overlying a portion of the semipolar surface. The laser stripe region is characterized by a cavity orientation substantially parallel to the projection of the c-direction. The laser stripe region has a first end and a second end. The laser stripe is characterized by a variable width. The variable width can have a narrow region to provide a single lateral optical mode and a wide region that is greater than about 3 μm. The device has an n-type cladding region overlying the semipolar surface and an active region comprising at least one active layer region overlying the n-type cladding region. The active layer region comprises a quantum well region or a double hetero-structure region. In other examples, the width is continuous and has varying width dimensions. The device has a p-type cladding region overlying the active region. The device is configured to emit a laser beam having a first polarization state and a second polarization state wherein the first polarization state is orthogonal to the second polarization state. The emitted laser beam is characterized by a polarization ratio between the power emitted in the first polarization state and the power emitted in the second polarization state of 0.85 and greater.

In an alternative example, the present invention provides a laser device. The device includes a gallium and nitrogen containing material having a semipolar surface configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The laser beam emitted by the device is characterized by a cross-polarized emission such that at least 15% of the emission is in a second polarization state. In certain embodiments, the device has an output power of over 125 mW and the polarization ratio between the first polarization state and the second polarization state is 0.85 and greater.

In another example, the invention provides a method of manufacturing an optical device. The method includes providing a gallium and nitrogen containing semipolar substrate member having a crystalline surface region. The semipolar surface is configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The gallium and nitrogen containing substrate member is characterized by a dislocation density of less than 10E7 cm$^{-2}$. The method includes forming a gallium and nitrogen containing n-type cladding layer overlying the surface region. The n-type cladding layer has a thickness from 300 nm to 6000 nm with an n-type doping level of 1E17 cm$^{-3}$ to 6E18 cm$^{-3}$. The method includes forming an n-side separate confining heterostructure (SCH) waveguiding layer overlying the n-type cladding layer. The n-side SCH waveguide layer comprises at least gallium, indium, and nitrogen with molar fraction of InN of between 1% and 12% and has a thickness from 20 nm to 150 nm. The method includes forming an active region overlying the n-side SCH waveguide layer. The active region comprises at least two quantum well regions, but in a preferred embodiment includes more quantum wells such a 4 to 6 quantum wells. The quantum wells comprise InGaN with a thickness of about 2 nm to about 8 nm and the quantum wells regions are separated by barrier regions. The barrier regions are comprised of at least gallium and nitrogen with a thickness of about 2.0 nm to about 25 nm. The method includes forming a p-type gallium and nitrogen containing cladding layer overlying the multiple quantum well active region. The p-type cladding layer has a thickness from 300 nm to 1000 nm with a p-type doping level of 1E17 cm$^{-3}$ to 5E19 cm$^{-3}$. The method includes forming a p++ gallium and nitrogen containing contact layer overlying the p-type cladding layer. The p++ gallium and nitrogen containing contact layer has a thickness from 10 nm to 120 nm with a p-type doping level of 1E19 cm$^{-3}$ to 1E22 cm$^{-3}$. The method includes forming a waveguide member, which is aligned substantially in the projection of the c-direction. The waveguide member comprises of a first end and a second end. The device has an electron blocking layer overlying the p-side guide layer. The electron blocking layer is comprised of AlGaN with molar fraction of AlN of between 4% and 22% and has a thickness from 5 nm to 25 nm and doped with magnesium.

In another example, the invention provides a method for manufacturing an optical device. The method includes providing a gallium and nitrogen containing semipolar substrate member having a crystalline surface region, the semipolar surface being configured on one of either a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The gallium and nitrogen containing substrate member is characterized by a dislocation density of less than 10 cm$^{-2}$. The method includes forming an n-type cladding layer comprising a first ternary AlGaN alloy or a first quaternary AlInGaN alloy. The first alloy comprises at least an aluminum bearing species, a gallium bearing species, and a nitrogen bearing species overlying the surface region. The n-type cladding layer has a thickness from 100 nm to 6000 nm with an n-type doping level of 5E16 cm$^{-3}$ to 6E18 cm$^{-3}$. The method includes forming an n-side separate confining heterostructure (SCH) waveguiding layer overlying the n-type cladding layer. The n-side SCH waveguide layer is comprised of InGaN with molar fraction of InN of between 1% and 10% and having a thickness from 30 nm to 150 nm. The method includes forming a multiple quantum well active region overlying the n-side SCH waveguide layer. The multiple quantum well active region is comprised of two to five 2 nm to 8 nm InGaN quantum wells separated by 2 nm to 20 nm gallium and nitrogen containing barrier layers. The method includes forming a p-type cladding layer comprising a second ternary AlGaN alloy or quaternary AlInGaN alloy overlying the active region. The p-type cladding layer has a thickness from 250 nm to 1000 nm and comprises a p-type doping species including magnesium at a concentration of 1E17 cm$^{-3}$ to 4E19 cm$^{-3}$. The method includes forming a p++ gallium and nitrogen containing contact layer overlying the p-type cladding layer. The p++ gallium and nitrogen containing contact layer has a thickness from 10 nm to 140 nm and comprises a p-type doping species including magnesium at a concentration of 1E19 cm$^{-3}$ to 1E22 cm$^{-3}$. The method includes forming a waveguide member, which is aligned substantially in the projection of the c-direction. The waveguide region comprises of a first end and a second end. The first end comprises a first facet and the second end comprising a second facet. The waveguide member has a first edge region formed on a first side of the waveguide member. The first edge region has a first etched surface formed on the first edge region. The waveguide member having a second edge region formed on a second side of the waveguide member and the second edge region has a second etched surface formed on the second edge region. In this example, the waveguide member is provided between the first facet and the second facet, the waveguide member having a length of greater than 20 microns and less than about 500 microns and the offcut of the semipolar orientation is between +/−5 degrees toward a c-plane and/or between +/−10 degrees towards an a-plane.

In a first aspect, laser devices are provided comprising: a gallium and nitrogen containing material having a semipolar surface configured on an offcut orientation to one of either a (60-6-1) plane, a (60-61) plane, a (50-5-1) plane, a (50-51) plane, a (40-4-1) plane, (40-41) plane, a (30-3-1) plane, a (30-31) plane, a (20-2-1) plane, a (20-21) plane, a (30-3-2), or a (30-32) plane; a laser stripe region formed overlying a portion of the semipolar surface, the laser stripe region being characterized by a cavity orientation substantially parallel to the projection of the c-direction, the laser stripe region having a first end and a second end; the laser stripe region characterized by a length less than 300 µm; a first facet provided on the first end of the laser stripe region; a second facet provided on the second end of the laser stripe region; an n-type cladding region overlying the semipolar surface; an active region comprising at least one active layer region overlying the n-type cladding region, the active region comprising a quantum well region or a double hetero-structure region; and a p-type cladding region overlying the active region; wherein the laser stripe region is characterized by a width configured to emit a laser beam having a selected ratio of a first polarization state and a second polarization state.

In a second aspect, laser devices are provided comprising: a gallium and nitrogen containing substrate having a semipolar surface configured on an offcut orientation to one of either a (30-3-1) plane, a (30-31) plane, a (20-2-1) plane, a (20-21) plane, a (30-3-2), or a (30-32) plane; an array of N single lateral mode laser stripes formed overlying the semipolar surface, wherein: each of the laser stripes is characterized by a cavity orientation substantially parallel to the projection of a c-direction, each of the laser stripes having a length less than 300 µm; each of the laser stripes is characterized by a width ranging from about 0.5 µm to about 2.5 µm; each of the laser stripes is configured to operate in a single lateral mode; each of the laser stripes is configured to emit a laser beam characterized by a first polarization state and a second polarization state, wherein the first polarization state is orthogonal to the second polarization state; and the laser device is configured to emit a plurality of laser beams, each of the plurality of laser beams characterized by a primary polarization state and a secondary polarization state, wherein a power emitted in the second polarization state is at less than 15% of a power emitted in the first polarization state.

In a third aspect, laser devices are provided comprising: a gallium and nitrogen containing material having a semipolar surface configured on an offcut orientation to one of either a (60-6-1) plane, a (60-61) plane, a (50-5-1) plane, a (50-51), a (40-4-1) plane, a (40-41) plane, a (30-3-1) plane, a (30-31) plane, a (20-2-1) plane, a (20-21) plane, a (30-3-2) plane, or a (30-32) plane; a laser stripe region formed overlying a portion of the semipolar surface, the laser stripe region being characterized by a cavity orientation substantially parallel to the projection of the c-direction, the laser stripe region having a first end and a second end; a first facet provided on the first end of the laser stripe region; a second facet provided on the second end of the laser stripe region; an n-type cladding region overlying the semipolar surface; an active region comprising at least one active layer region overlying the n-type cladding region; the active region comprising a quantum well region or a double hetero-structure region; and a p-type cladding region overlying the active region; a width characterizing the laser stripe region configured to emit a laser beam having a first polarization state and a second polarization state, the first polarization state being orthogonal to the second polarization state and the first polarization state being the primary polarization state; and a polarization ratio of the laser beam characterizing a cross-polarized emission such that at least 15% of an emitted power is in the second polarization state.

In a fourth aspect, methods of manufacturing optical devices are provided, the methods comprising: providing a gallium and nitrogen containing semipolar substrate member having a crystalline surface region; the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane; the gallium and nitrogen containing substrate member characterized by a dislocation density of less than 10$^7$ cm$^{-2}$; forming a gallium and nitrogen containing n-type cladding layer overlying the surface region, the n-type cladding layer having a thickness from 300 nm to 6000 nm with an n-type doping level of 1E17 cm$^{-3}$ to 6E18 cm$^{-3}$; forming an n-side separate confining heterostructure (SCH) waveguiding layer overlying the n-type cladding layer, the n-side SCH waveguide layer comprising gallium, indium, and nitrogen with a molar fraction of InN of between 1% and 12% and having a thickness from 20 nm to 150 nm; forming an active region overlying the n-side SCH waveguiding layer, the active region comprising at least two quantum wells, the at least two quantum wells comprising InGaN with a thickness of about 2 nm to about 8 nm; the at least two quantum wells separated by barrier regions, the barrier regions comprising gallium and nitrogen with a thickness of about 2.5 nm to about 25 nm; forming a p-type gallium and nitrogen containing cladding layer overlying the active region, the p-type cladding layer having a thickness from 300 nm to 1000 nm with a p-type doping level of 1E17 cm$^{-3}$ to 5E19 cm$^{-3}$; forming a p++ gallium and nitrogen containing contact layer overlying the p-type cladding layer, the p++ gallium and nitrogen containing contact layer having a thickness from 10 nm to 120 nm with a p-type doping level of 1E19 cm$^{-3}$ to 1E22 cm$^{-3}$; and forming a waveguide member overlying the p++ gallium and nitrogen contact layer, the waveguide member aligned substantially in the projection of the c-direction, the waveguide member comprising a first end and a second end, the waveguide member being characterized by a length of less than 300 microns.

In a fifth aspect, methods for manufacturing optical devices are provided, the methods comprising: providing a gallium and nitrogen containing semipolar substrate member having a crystalline surface region, the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane, the gallium and nitrogen containing semipolar substrate member being characterized by a dislocation density of less than $10^7$ cm$^{-2}$; forming an n-type cladding layer comprising a first ternary AlGaN alloy or a first quaternary AlInGaN alloy, the first alloy comprising at least an aluminum bearing species, a gallium bearing species, and a nitrogen bearing species overlying the surface region, the n-type cladding layer having a thickness from 100 nm to 6,000 nm with an n-type doping level of 5E16 cm$^{-3}$ to 6E18 cm$^{-3}$; forming an n-side separate confining heterostructure (SCH) waveguiding layer overlying the n-type cladding layer, the n-side SCH waveguiding layer comprising InGaN with a molar fraction of InN of between 1% and 10% and having a thickness from 30 nm to 150 nm; forming a multiple quantum well active region overlying the n-side SCH waveguiding layer, the multiple quantum well active region comprising two to five, 2 nm to 8 nm thick, InGaN quantum wells separated by 3 nm to 20 nm thick gallium and nitrogen containing barrier layers; forming a p-type cladding layer comprising a second ternary AlGaN alloy or quaternary AlInGaN alloy overlying the multiple quantum well active region, the p-type cladding layer having a thickness from 250 nm to 1,000 nm and comprising a p-type doping species including magnesium at a concentration of 1E17 cm$^{-3}$ to 4E19 cm$^{-3}$; forming a p++ gallium and nitrogen containing contact layer overlying the p-type cladding layer, the p++ gallium and nitrogen containing contact layer having a thickness from 10 nm to 140 nm and comprising a p-type doping species including magnesium at a concentration of 1E19 cm$^{-3}$ to 1E22 cm$^{-3}$; and forming a waveguide member, the waveguide member being aligned substantially in the projection of the c-direction, the waveguide member comprising of a first end and a second end, the first end comprising a first facet, the second end comprising a second facet, the waveguide member provided between the first facet and the second facet and being characterized by a length of less than 300 microns, the waveguide member having a first edge region formed on a first side of the waveguide member, the first edge region having a first etched surface formed on the first edge region, the waveguide member having a second edge region formed on a second side of the waveguide member, the second edge region having a second etched surface formed on the second edge region.

In a sixth aspect, methods of manufacturing optical devices are provided, the methods comprising: providing a gallium and nitrogen containing semipolar substrate member having a crystalline surface region; the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane; the gallium and nitrogen containing semipolar substrate member characterized by a dislocation density of less than $10^7$ cm$^{-2}$; forming a gallium and nitrogen containing n-type cladding layer overlying the surface region, the n-type cladding layer having a thickness from 300 nm to 6000 nm with an n-type doping level of 1E17 cm$^{-3}$ to 6E18 cm$^{-3}$, the n-type cladding layer being substantially free from an aluminum bearing material; forming an n-side separate confining heterostructure (SCH) waveguiding layer overlying the n-type cladding layer, the n-side SCH waveguiding layer comprising gallium, indium, and nitrogen with a molar fraction of InN of between 1% and 12% and having a thickness from 20 nm to 150 nm; forming an active region overlying the n-side SCH waveguiding layer, the active region comprising at least two quantum well regions, the at least two quantum wells comprising InGaN with a thickness of about 2 nm to about 8 nm; the at least two quantum wells separated by barrier regions, the barrier regions comprising least gallium and nitrogen with a thickness of about 2.5 nm to about 25 nm; forming a p-type gallium and nitrogen containing cladding layer overlying the active region, the p-type cladding layer having a thickness from 300 nm to 1000 nm with a p-type doping level of 1E17 cm$^{-3}$ to 5E19 cm$^{-3}$; forming a p++ gallium and nitrogen containing contact layer overlying the p-type gallium and nitrogen containing cladding layer, the p++ gallium and nitrogen containing contact layer having a thickness from 10 nm to 120 nm with a p-type doping level of 1E19 cm$^{-3}$ to 1E22 cm$^{-3}$; and forming a waveguide member, the waveguide member aligned substantially in the projection of the c-direction, the waveguide member comprising a first end and a second end, the waveguide member being characterized by a length of less than 300 microns.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

This present invention is directed to optical devices and related methods. In particular, the present invention provides a method and device for emitting electromagnetic radiation using semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

Forming laser diodes on semipolar orientations of gallium and nitrogen containing material (e.g., GaN) can be advantageous. Such lasers may include long wavelength emission, high gain properties, improved material quality, and/or increased design flexibility over alternative planes such as the conventional polar c-plane or even the nonpolar m-plane or polar c-plane. For example, we have fabricated true green laser diodes on the (20-21) semipolar plane and found that the (30-3-1) semipolar plane offers narrower full width at half maximum (FWHM) emission spectra and higher gain compared to the nonpolar m-plane in the blue regime, as described in U.S. application Ser. No. 12/883,093 filed on Sep. 15, 2010, which is incorporated by reference.

Figure 1:
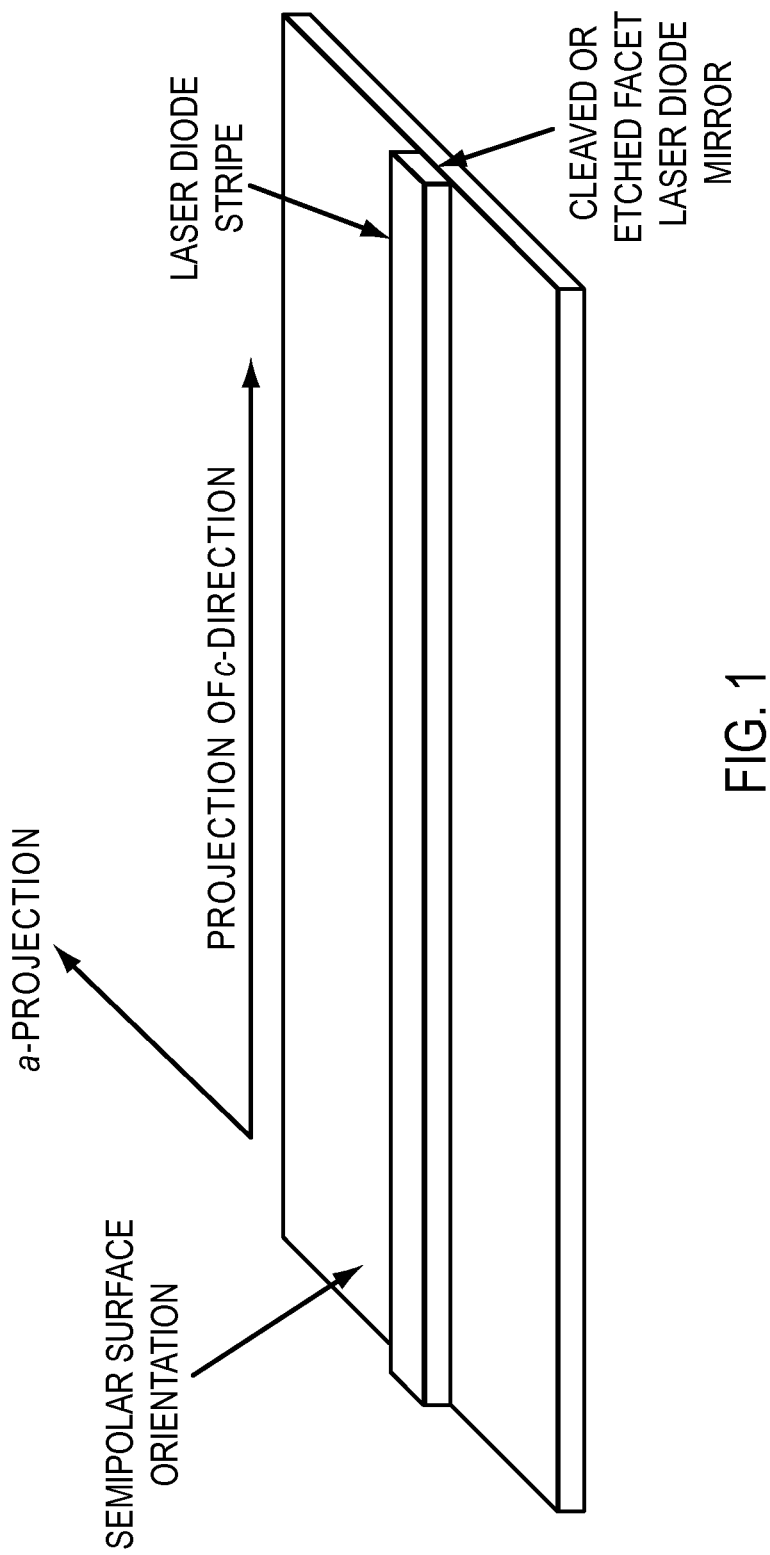
FIG. 1 is a simplified diagram of laser device according to certain embodiments of the present invention.

As an example, FIG. 1 is a simplified schematic diagram of semipolar laser diode with the cavity aligned in the projection of c-direction with cleaved or etched mirrors. Example of projection of c-direction oriented laser diode stripe on semipolar (30-3-1) substrate with cleaved or etched mirrors. As shown, the optical device includes a gallium nitride substrate member having a semipolar crystalline surface region characterized by an orientation of about 9 degrees to about 12.5 degrees towards (000-1) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ $cm^{-2}$ or $10^5$ to $10^7$ $cm^{-2}$. It should be noted that homoepitaxial growth on bulk GaN is generally better than hetero-epitaxy growth. The nitride crystal or wafer may comprise $Al_xIn_yGa_{1-x-y}N$, where $0 \leq x, y, x+y \leq 1$. In an embodiment, the nitride crystal comprises GaN. In one or more embodiments, the GaN substrate has threading dislocations, at a concentration between about $10^5$ $cm^{-2}$ and about $10^8$ $cm^{-2}$, in a direction that is substantially orthogonal or oblique with respect to the surface. As a consequence of the orthogonal or oblique orientation of the dislocations, the surface dislocation density is below about $10^5$ $cm^{-2}$ or below about $10^7$ $cm^{-2}$ others such as those ranging from about $10^5$-$10^8$ $cm^{-2}$. In alternative example, is a projection of the c-direction oriented laser diode stripe on semipolar (20-21) substrate with cleaved or etched mirrors. The optical device includes a gallium nitride substrate member having a semipolar crystalline surface region characterized by an orientation of about 13 degrees to about 17 degrees towards (0001) from the m-plane.). In an embodiment, the gallium nitride substrate member is a bulk GaN substrate characterized by having a semipolar crystalline surface region, but can be others. In an embodiment, the bulk GaN substrate has a surface dislocation density below $10^5$ $cm^{-2}$ or $10^5$ to $10^7$ $cm^{-2}$.

In an embodiment, the device has a laser stripe region formed overlying a portion of the semipolar crystalline orientation surface region. In an embodiment, the laser stripe region is characterized by a cavity orientation that is substantially parallel to the projection of the c-direction. In an embodiment, the laser stripe region has a first end and a second end.

In an embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In an embodiment, the first mirror surface is provided by a scribing and breaking process or alternatively by etching techniques using etching technologies such as reactive ion etching (RIE), inductively coupled plasma etching (ICP), or chemical assisted ion beam etching (CAIBE), or other method. Any suitable scribing process can be used, such as a diamond scribe or laser scribe or combinations. In an embodiment, the first mirror surface comprises a reflective coating. In an embodiment, the reflective coating can be deposited using, for example, e-beam evaporation, thermal evaporation, RF sputtering, DC sputtering, ECR sputtering, ion beam deposition, Ion Assisted Deposition, reactive ion plating, any combinations, and the like. In still other embodiments, surface passivation may be used to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be cleaved or etched or a combination of them.

Also in an embodiment, the second facet comprises a second mirror surface. The second mirror surface is provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. Preferably, the scribing is diamond scribed or laser scribed or the like. In an embodiment, the second mirror surface comprises a reflective coating, such as silicon dioxide, hafnia, titania, tantalum pentoxide, zirconia, aluminum oxide, combinations, and the like. In an embodiment, the second mirror surface comprises an anti-reflective coating, such alumina or aluminum oxide. In an embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating.

In an embodiment, the laser stripe has a length and width. The length ranges from about 20 microns to about 500 microns. The stripe also has a width ranging from about 0.5 microns to about 50 microns, but can be other dimensions. In an embodiment, the stripe can also be about 3 to 25 microns wide for a high power multi-lateral-mode device or about 1 to 2 microns for a single lateral mode laser device. In an embodiment, the width is substantially constant in dimension, although there may be slight variations. The width and length are often formed using a masking and etching process, which are commonly used in the art.

In an embodiment, the device is also characterized by a spontaneously emitted light that is polarized in substantially perpendicular to the projection of the c-direction (in the a-direction). That is, the device performs as a laser or the like. In an embodiment, the spontaneously emitted light is characterized by a polarization ratio of greater than 0.2 to about 1 perpendicular to the c-direction. In an embodiment, the spontaneously emitted light is characterized by a wavelength ranging from about 400 nanometers to yield a violet emission, a blue emission, a green emission, and/or others. In certain embodiments, the light can be emissions ranging from violet 395 nm to 420 nm; blue 430 nm to 470 nm; green 500 nm to 550 nm; or others, which may slightly vary depending upon the application. In an embodiment, the spontaneously emitted light is highly polarized and is characterized by a polarization ratio of greater than 0.4. In an embodiment, the emitted light is characterized by a polarization ratio that is preferred.

Figure 2:
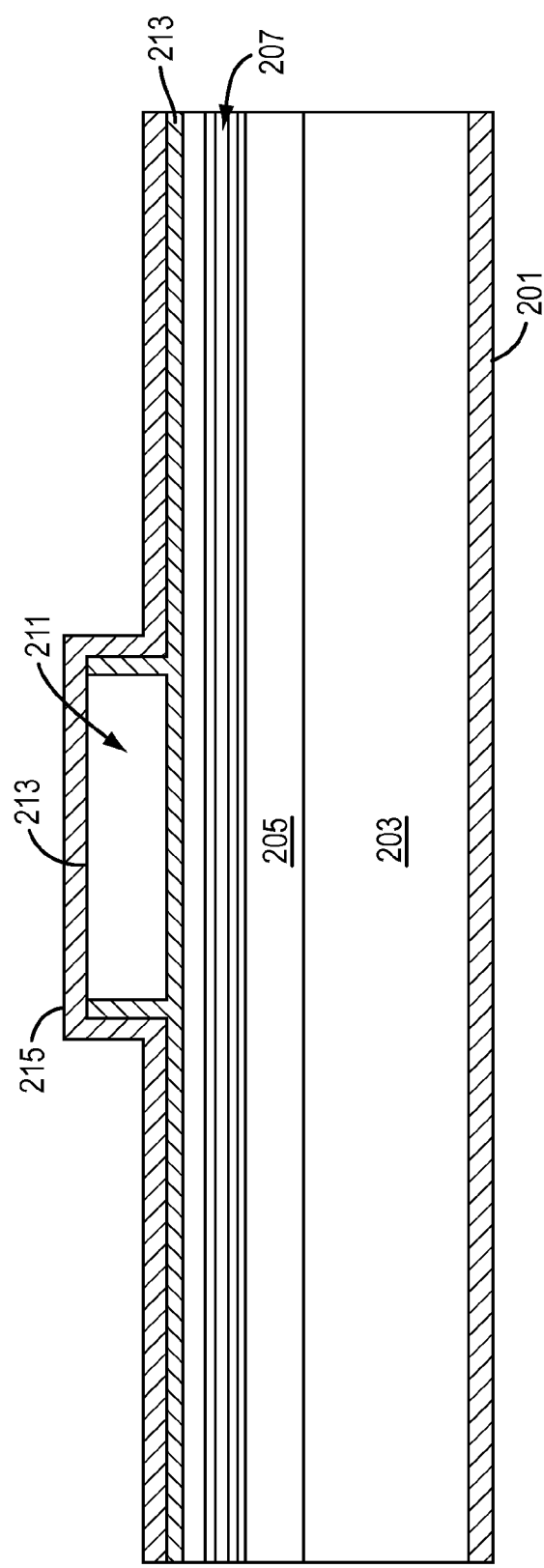
FIG. 2 is a simplified diagram of laser device according to certain embodiments of the present invention.

FIG. 2 is a simplified schematic cross-sectional diagram illustrating a laser diode structure according to embodiments of the present disclosure. As shown, the laser device includes gallium nitride substrate 203, which has an underlying n-type metal back contact region 201. In an embodiment, the metal back contact region is made of a suitable material such as those noted below and others.

In an embodiment, the device also has an overlying n-type gallium nitride layer 205, an active region 207, and an overlying p-type gallium nitride layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm to 50 nm, or other thicknesses. In an embodiment, the doping level can be higher than the p-type cladding region and/or bulk region. In an embodiment, the p++ type region has doping concentration ranging from about $10^{19}$ Mg/cm$^{-3}$ to $10^{21}$ Mg/cm$^{-3}$, or others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments, the high quality layer is doped, for example, with Si or O to form n-type material, with a dopant concentration between about $10^{16}$ cm$^{-3}$ and $10^{20}$ cm$^{-3}$.

In an embodiment, an n-type $Al_uIn_vGa_{1-u-v}N$ layer, where $0 \leq u$, v, u+v<1, is deposited on the substrate. In an embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 degrees Celsius to about 1200 degrees Celsius in the presence of a nitrogen-containing gas. As an example, the carrier can be hydrogen or nitrogen or others. In an embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to that of the group III precursor (trimethylgallium, triethylgallium, trimethylindium, trimethylaluminum) during growth is between about 2,000 and about 12,000. A flow of disilane in a carrier gas, with a total flow rate of between about 0.1 and 10 sccm is initiated.

In an embodiment, the laser stripe region is made of the p-type gallium nitride layer 211. In an embodiment, the laser stripe is provided by an etching process selected from dry etching or wet etching. In an embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++ gallium nitride region. In an embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and platinum (Ni/Au), but can be others such as gold and palladium (Pd/Au), gold, titanium, and palladium (Pd/Ti/Au) or gold and nickel (Pt/Au). In an alternative embodiment, the metal layer comprises Pd/Au formed using suitable techniques. In an embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others.

In an embodiment, the dielectric region can be made using a suitable technique. As an example, the technique may include reactively sputter of $SiO_2$ using an undoped polysilicon target (99.999% purity) with $O_2$ and Ar. In an embodiment, the technique uses RF magnetron sputter cathodes configured for static deposition; sputter target; throw distance; pressure: 1-5 mT or about 2.5 mT, power: 300 to 400 W; flows: 2-3.-9 sccm $O_2$, 20-50 sccm, Ar, deposition thickness: 1000-2500 A, and may include other variations. In an embodiment, deposition may occur using non-absorbing, nonconductive films, e.g., $Al_2O_3$, $Ta_2O_5$, $SiO_2$, $Ta_2O_5$, $ZrO_2$, $TiO_2$, $HfO_2$, $NbO_2$. Depending upon the embodiment, the dielectric region may be thinner, thicker, or the like. In other embodiments, the dielectric region can also include multilayer coatings, e.g., 1000 A of $SiO_2$ capped with 500 A of $Al_2O_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like.

In an embodiment, the laser device has active region 207. The active region can include one to twenty quantum well regions according to one or more embodiments. As an example, following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. Preferably, the active layer may include about 3-7 quantum wells or more preferably 4-6 quantum wells or others. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, w+x, y+z$\leq$1, where w<u, y and/or x>v, z so that the bandgap of the well layer(s) is less than that of the barrier layer(s) and the n-type layer. The well layers and barrier layers may each have a thickness between about 1 nm and about 40 nm. In an embodiment, each of the thicknesses is preferably 2 nm-8 nm. In an embodiment, each well region may have a thickness of about 4 nm to 7 nm and each barrier region may have a thickness of about 2 nm to about 5 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

In an embodiment, the active region can also include an electron blocking region, and a separate confinement heterostructure. In an embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to an embodiment. In one or more embodiments, the SCH layers have a preferred thickness, impurity, and configuration above and below the active region to confine the optical mode. Depending upon the embodiment, the upper and lower SCH can be configured differently or the same. The electron blocking region can be on either side or both sides of the SCH positioned above the active region according to an embodiment. In an embodiment, the SCH can range from about 10 nm to about 150 nm, and preferably about 40 to 100 nm for the lower SCH region. In the upper SCH region, the thickness ranges from about 20 to 50 nm in an embodiment. As noted, the SCH is preferably InGaN having about 2% to about 5% indium or 5% to about 10% by atomic percent according to an embodiment.

In some embodiments, an electron blocking layer is preferably deposited. In an embodiment, the electron blocking layer comprises a gallium and nitrogen containing material including magnesium at a concentration of about $10^{16}$ cm$^{-3}$ to about $10^{22}$ cm$^{-3}$. The electron-blocking layer may comprise $Al_sIn_tGa_{1-s-t}N$, where $0 \leq s$, $t$, $s+t \leq 1$, with a higher bandgap than the active layer, and may be doped p-type. In one specific embodiment, the electron blocking layer comprises AlGaN with an Al composition ranging from 5% to 20%. In another embodiment, the electron blocking layer may not contain Al. In another embodiment, the electron blocking layer comprises an AlGaN/GaN super-lattice structure, comprising alternating layers of AlGaN and GaN, each with a thickness between about 0.2 nm and about 5 nm.

As noted, the p-type gallium nitride structure, which can be a p-type doped $Al_qIn_rGa_{1-q-r}N$, where $0 < q$, $r$, $q+r < 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 5 nm to 70 nm of the p-type layer may be doped more heavily than the rest of the layer, so as to enable an improved electrical contact. In an embodiment, the laser stripe is provided by an etching process selected from dry etching or wet etching. In an embodiment, the etching process is dry, but can be others. The device also has an overlying dielectric region, which exposes 213 contact region. In an embodiment, the dielectric region is an oxide such as silicon dioxide, but can be others.

In an embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In an embodiment, the electrical contact serves as a p-type electrode for the optical device. In another embodiment, the electrical contact serves as an n-type electrode for the optical device. Of course, there can be other variations, modifications, and alternatives.

In an embodiment, a ridge waveguide is fabricated using a certain deposition, masking, and etching processes. In an embodiment, the mask is comprised of photoresist (PR) or dielectric or any combination of both and/or different types of them. The ridge mask is about 1 microns to about 2.5 microns wide for single lateral mode applications or 2.5 μm to 30 μm wide for multimode applications. The ridge waveguide is etched by ion-coupled plasma (ICP), reactive ion etching (RIE), chemical assisted ion beam (CAIBE) etched, or other method. The etched surface is 20 nm to 250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80 nm-400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au.

In one or more preferred embodiments, the present disclosure provides a laser structure without an aluminum bearing cladding region. In an embodiment, the laser device comprises a multi-quantum well active region having thin barrier layers. In one or more embodiments, the active region comprises three or more quantum well structures. Between each of the quantum well structures there may be a thin barrier layer, e.g., 7 nm and less, 6 nm and less, 5 nm and less, 4 nm and less, 3 nm and less, 2 nm and less. In an embodiment, the combination of thin barrier layers in the multi-quantum well structures enables a low voltage (e.g., 6 volts and less) laser diode free from use of aluminum bearing cladding regions.

In an embodiment, the present disclosure provides an optical device. The optical device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), and/or an offcut orientation, or offcuts thereof crystalline surface region orientation, which may be off-cut. The device preferably has an n-type cladding material overlying the n-type gallium and nitrogen containing material according to an embodiment. The n-type cladding material may be formed from GaN, AlGaN, InAlGaN, or a combination and ranges in thickness from about 1 μm to about 5 μm according to an embodiment. The n-type cladding material may be doped with silicon or oxygen. The device also has an active region comprising at least three quantum wells. Each of the quantum wells has a thickness of 3.0 nm and greater or 5.5 nm and greater, and one or more barrier layers. Each of the barrier layers has a thickness ranging from about 2 nm to about 4 nm or about 4 nm to about 8 nm or about 8 nm to about 20 nm and is configured between a pair of quantum wells according to an embodiment. At least one or each of the barrier layers has a thickness ranging from about 2 nm to about 4 nm and is configured between a pair of quantum wells or adjacent to a quantum well according to an embodiment. At least one or each of the barrier layers has a thickness ranging from about 3.5 nm to about 6.5 nm and is configured between a pair of quantum wells or adjacent to a quantum well according to an embodiment. Preferably, the device has a p-type cladding material overlying the active region. Preferably, the p-type cladding material may be formed from GaN, AlGaN, InAlGaN, or a combination and ranges in thickness from about 0.4 μm to about 1 μm according to an embodiment. The p-type cladding material may be doped with magnesium. In an embodiment, the active region is configured for a forward voltage of less than about 6V or less than about 5V for the device for an output power of 60 mW or 100 mW and greater.

In yet an alternative embodiment, the present disclosure provides an optical device. The device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), and/or an offcut orientation. The device also has an n-type cladding material overlying the n-type gallium and nitrogen containing material. The n-type cladding material may be formed from GaN, AlGaN, InAlGaN, or a combination of any of the foregoing, and may range in thickness from about 1 µm to about 5 µm according to an embodiment. The n-type cladding material may be doped with silicon or oxygen. The device further has an active region comprising at least three quantum wells. Each of the quantum wells has a thickness of 2.0 nm and greater or 3.5 nm and greater or 5 nm and greater and one or more barrier layers according to an embodiment. Each of the barrier layers has a thickness ranging from about 2 nm to about 4 nm or about 4 nm to about 8 nm or about 8 nm to about 20 nm according to an embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to an embodiment. At least one or each of the barrier layers has a thickness ranging from about 4 nm to about 8 nm and is configured between a pair of quantum wells or adjacent to a quantum well according to an embodiment. The device also has a p-type cladding material overlying the active region. Preferably, the p-type cladding material may be formed from GaN, AlGaN, InAlGaN, or a combination and ranges in thickness from about 0.4 Lm to about 1 µm according to an embodiment. The p-type cladding material may be doped with magnesium. The device optionally has a p-type material overlying the p-type cladding material.

In other embodiments, the invention provides yet an alternative optical device, which has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 2.5 nm or 3.5 nm and greater. The device has one or more barrier layers, each of which has a thickness ranging from about 2 nm to about 4 nm or about 4 nm to about 8 nm or about 8 nm to about 20 nm in one or more alternative embodiments. Preferably, each of the barrier layers is configured between a pair of quantum wells according to an embodiment. The device also has a p-type cladding material overlying the active region according to an embodiment. The p-type cladding material is substantially free from an aluminum bearing material according to an embodiment. The device also has a p-type material overlying the p-type cladding material.

In other embodiments, the invention provides a method of fabricating an optical device, which has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 2.5 nm or 3.5 nm and greater. The device has one or more barrier layers, each of which has an n-type impurity characteristic and a thickness ranging from about 2 nm to about 4 nm or about 4 nm to about 8 nm or about 8 nm to about 20 nm in one or more alternative embodiments. Preferably, each of the barrier layers is configured between a pair of quantum wells according to an embodiment. The method also includes forming a p-type cladding material overlying the active region according to an embodiment. The p-type cladding material is substantially free from an aluminum bearing material according to an embodiment. The method also includes forming a p-type material overlying the p-type cladding material.

In an embodiment, the present disclosure provides an optical device, such as a laser diode. The device has a gallium and nitrogen containing substrate including a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region orientation, which may be off-cut according to one or more embodiments. The device has an n-type cladding material overlying the n-type gallium and nitrogen containing material. The n-type cladding material may be formed from GaN, AlGaN, InAlGaN, or a combination of any of the forgoing and may range in thickness from about 1 m to about 5 Lm according to an embodiment. The n-type cladding material may be doped with silicon or oxygen. The device also has an active region comprising at least three quantum wells. In an embodiment, each of the quantum wells has a thickness of 2.0 nm or 3.5 nm and greater and one or more barrier layers according to an embodiment. Each of the barrier layers has a n-type characteristic and a thickness ranging from about 2 nm to about 4.5 nm in an embodiment. Each of the barrier layers has a p-type characteristic and a thickness ranging from about 3.5 nm to about 7 nm in an alternative specific embodiment. In an embodiment, each of the barrier layers is configured between a pair of quantum wells. The device also has a p-type cladding material overlying the active region. Preferably, the p-type cladding material may be formed from GaN, AlGaN, InAlGaN, or a combination of any of the foregoing and may range in thickness from about 0.3 m to about 1 µm according to an embodiment. The p-type cladding material may be doped with magnesium. And overlying p-type material is included. In an embodiment, the active region is configured for a forward voltage of less than about 6V or less than about 7V for the device for an output power of 60 mW and greater. In other embodiments, for nonpolar m-plane devices or semipolar (60-6-1), (60-61), (50-5-1), (50-51), (40-4-1), (40-41), (30-3-1), a (30-31), a (20-2-1), a (20-21), a (30-3-2), a (30-32), or offcuts thereof planes, operable in the blue (430 nm-475 nm) and green (505-530 nm), the present method and structure include five (5) or more thick quantum wells of greater than 4 nm or 5 nm in thickness and thin barriers that are 2-4 nm in thickness.

In one or more embodiments, the present disclosure includes a laser diode substantially free from an aluminum containing cladding region. The diode that is free from aluminum containing cladding regions has faster growth times, and is not plagued with aluminum bearing materials in the cladding. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 3 nm to 4 nm, which are much thinner than conventional lasers such as those in Yoshizumi et al., "Continuous-Wave operation of 520 nm Green InGaN-Based Laser Diodes on Semi-Polar {20-

21}GaN Substrates," Applied Physics Express, 2 (2009) 092101. We have also determined that the forward voltage can be reduced in multi-quantum well active regions by adding p or n-type dopant species to the active region according to one or more embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present disclosure provides a laser device and method with low voltage on (60-6-1), (60-61), (50-5-1), (50-51), (40-4-1), (40-41), (30-3-1), a (30-31), a (20-2-1), a (20-21), a (30-3-2), a (30-32), or offcuts thereof.

The device has a gallium and nitrogen containing substrate member having a (60-6-1), (60-61), (50-5-1), (50-51), (40-4-1), (40-41), (30-3-1), a (30-31), a (20-2-1), a (20-21), a (30-3-2), a (30-32), or offcuts thereof crystalline surface region. The device has an n-type gallium and nitrogen containing cladding material. In an embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In an embodiment, the p-type gallium and nitrogen containing cladding material is substantially free from an aluminum species. The device preferably includes a laser stripe region configured from at least the active region and characterized by a cavity orientation substantially parallel to a projection of the c-direction. The laser stripe region has a first end and a second end. The device also has a first cleaved or etched facet provided on the first end of the laser stripe region and a second cleaved or etched facet provided on the second end of the laser stripe region. Depending upon the embodiment, the facets may be cleaved, etched, or a combination of cleaved and etched. In yet other embodiments, the present device includes a gallium and nitrogen containing electron-blocking region that is substantially free from aluminum species. In yet other embodiments, the device does not include any electron-blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In some preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates." Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum containing cladding layers is also cumbersome and can take additional time to grow. In fact, by using substantially Al-free cladding layers MOCVD growth throughput can be increased by 2-4× drastically reducing the cost associated with growth. Accordingly, it is believed that the aluminum cladding free laser method and structure are generally more efficient to grow than conventional laser structures.

Figure 3A:
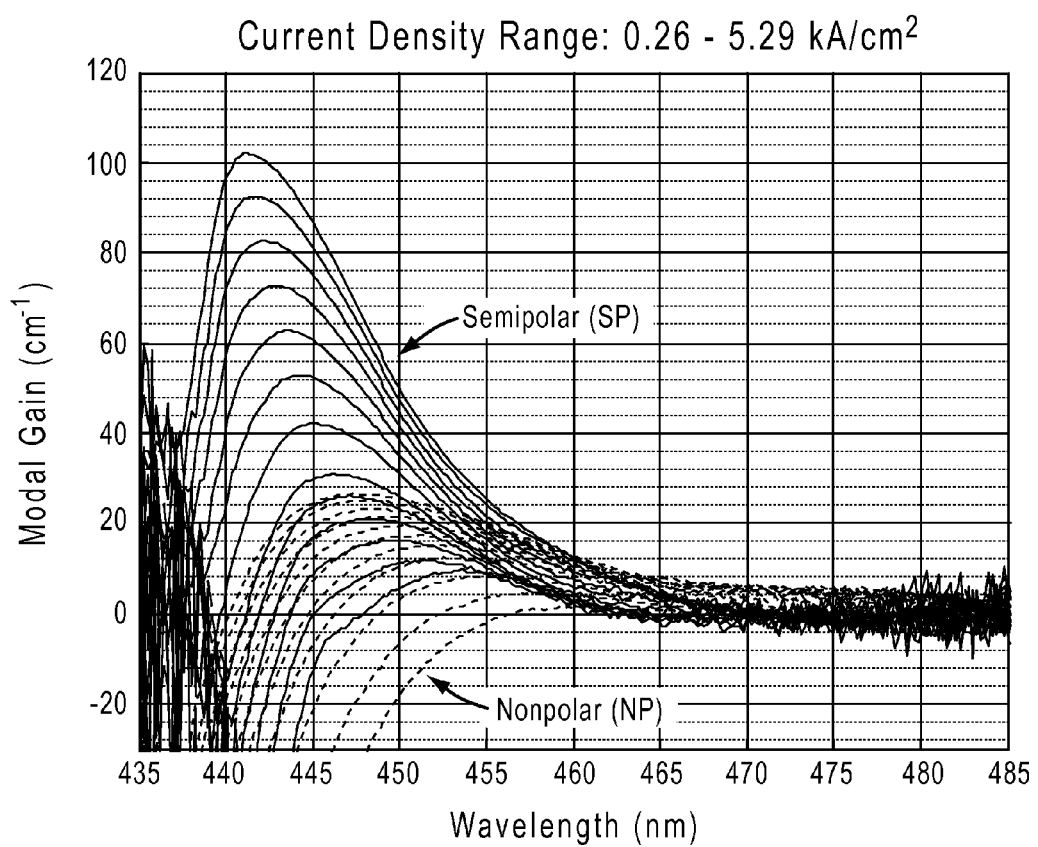
FIGS. 3A and 3B presents the measured gain spectra and extracted peak modal gain versus current density, respectively, for equivalent laser structures formed on m-plane and on the (30-3-1) semipolar plane showing nearly 3 times greater gain on (30-3-1) than on nonpolar.

As an example, FIG. 3A a presents the measured gain spectra at various current densities ranging from 0.26 kA/cm$^2$ to 5.29 kA/cm$^2$ for identical blue laser epitaxial structures grown on m-plane and (30-3-1). As seen in the figure, the peak modal gain in the semipolar (30-3-1) structure is drastically higher than in the nonpolar structure at a given current density.

Figure 3B:
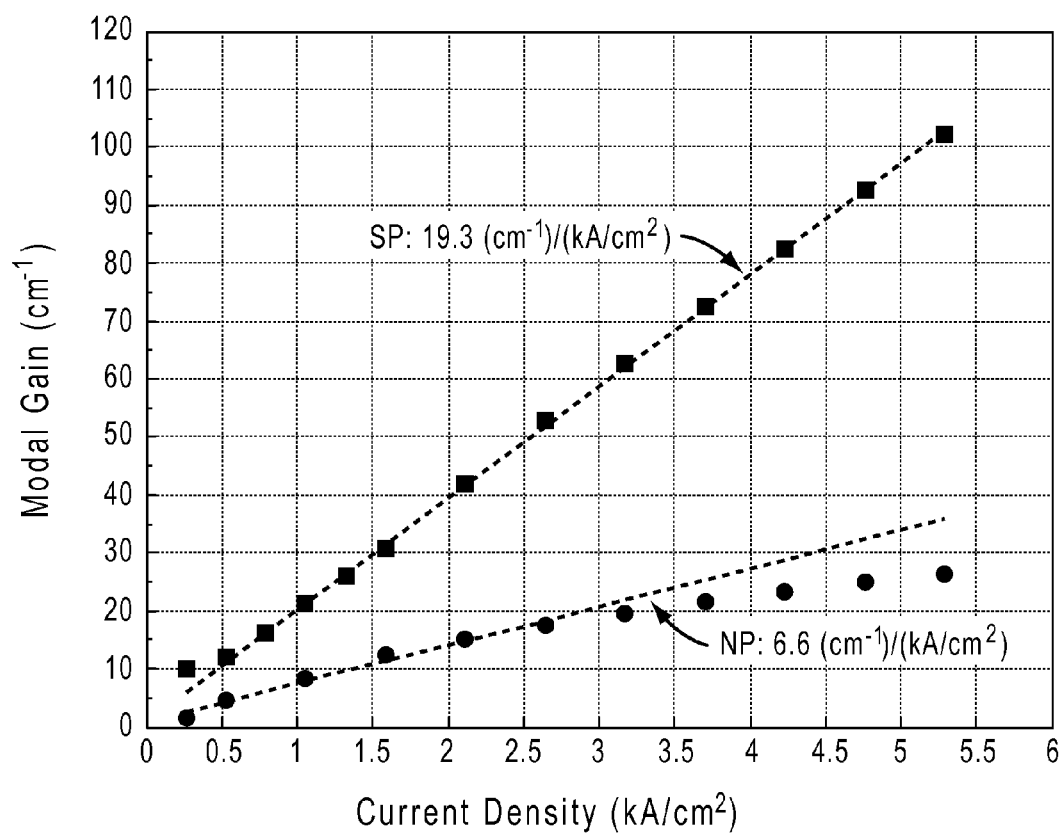

FIG. 3B presents the plots of peak modal gain versus current density for these equivalent laser structures as extracted from the data in FIG. 3B. The slopes of the resulting plots provide the so called differential gain in the laser cavity. The peak differential gain of the semipolar (30-3-1) structures of 19.3 (cm$^{-1}$)/(kA/cm$^2$) is about 3-times higher than of the nonpolar at 6.6 (cm$^{-1}$)/(kA/cm$^2$). Such drastically higher gain characteristics will lead to improved laser diode performance. For example an equivalent laser structure with identical losses with 3 times the gain can have approximately ⅓ the threshold current density for an overall higher efficiency, as described in "Group III nitride laser diodes grown on a semipolar orientation of gallium nitride," U.S. Ser. No. 61/664,084 filed on Jun. 25, 2012, which is incorporated by reference herein. Moreover, such high differential modal gain can enable ultra-short edge emitting laser cavity lengths of 50-200 μm with low threshold current densities of below 3 kA/cm$^2$ in and good high slope efficiencies of over 0.7 W/A, over 1.2 W/A, or over 1.5 W/A.

As the cavity length is reduced in an edge-emitting laser diode the mirror loss is inversely proportionally increased. As the mirror loss is increased the slope efficiency, the amount of unit optical output power per unit of electrical input current, is increased such that more output power will be achieved for a given operating current. However, the increased mirror loss will also result in an increased threshold modal gain such that the laser material will have to provide a higher gain to achieve threshold. If the differential gain characteristics dictated by the material and waveguide design of the device are held constant the higher required threshold modal gain would result in a higher threshold current density, meaning the input current required for the laser to achieve threshold would be increased. This degradation of increased threshold current counter acts the benefit achieved from higher slope efficiency as the cavity length is reduced, and for a fixed cavity gain and internal loss characteristic it is this trade-off that sets the optimal cavity length and the front and back mirror coating reflectivities. For c-plane GaN edge emitting laser diodes operating in the low power regime of less than 300 mW typical cavity lengths range from 400 μm to 600 μm. This cavity length range is largely dictated by the differential modal gain within the conventional c-plane laser diodes which sets the amount of cavity losses can be overcome at a reasonable threshold current density of less than about 4 kA/cm$^2$ or less than about 2 kA/cm$^2$.

Figure 4:
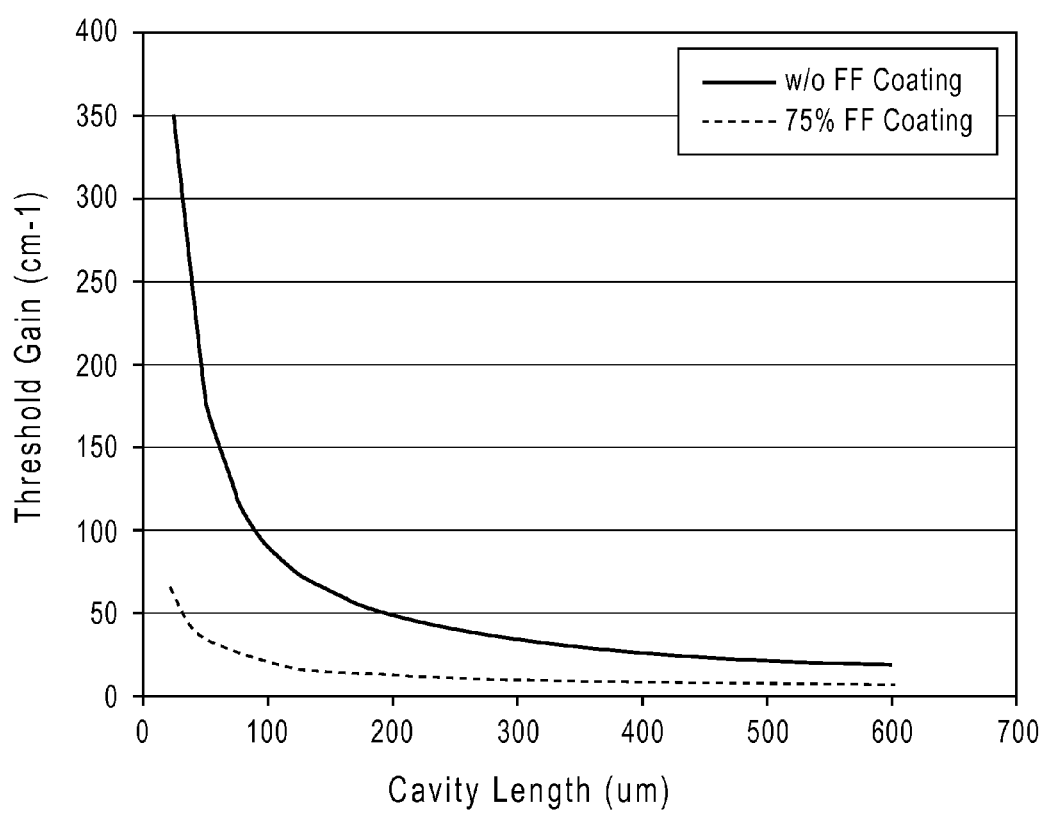
FIG. 4 presents a simulation of threshold modal gain versus cavity length of for gallium and nitrogen containing LDs with back facet coatings of 99% reflectivity and no front facet coating and 75% reflectivity.

As an example, FIG. 4 presents simulations of the threshold gain versus cavity length for edge emitting GaN-based lasers with an assumed internal loss of 5 cm$^{-1}$. The solid curve represents a laser with a 99% reflective coating on the back facet and no reflective coating on the front facet, while the dashed curve represents a laser with a 99% reflective coating on the back facet and a 75% reflective coating on the front facet. The curves demonstrate that the threshold gain rapidly increases for cavity lengths shorter than 200 μm with no reflective coating on front facet and drastically increases for cavity lengths shorter than 50 μm with a 75% reflective coating on front facet. This indicates that to achieve lasing at a low threshold current density the laser diode must possess high differential modal gain to overcome the cavity loss to reach threshold.

In this invention we exploit the high modal gain of gallium and nitrogen containing semipolar laser diodes to achieve ultra-short cavity lengths with viable threshold current densities. With the high material gain and high confinement active region designs enabled in semipolar laser diodes cavity lengths of less than 300 μm, less than 200 μm, less than 100 μm, and even less than 50 μm can be achieved. This breakthrough will break the paradigm of 450 μm to 600 μm cavity lengths currently used in c-plane devices and offer several advantages such as reduced cost, higher efficiency, and smaller form factor. For example, since the chip length of a conventional linear-cavity edge emitting laser diode is constrained by the length of the cavity, by reducing the cavity length in a GaN-based ~100 mW edge emitting laser diode from the typical length of 500 m to 600 μm to a length of only 100 μm a given wafer can yield 5- to 6-times more laser chips. This can result in up to a 5- or 6-times reduction in chip cost and enable ultra-low cost laser chips to enable new markets.

Figure 5:
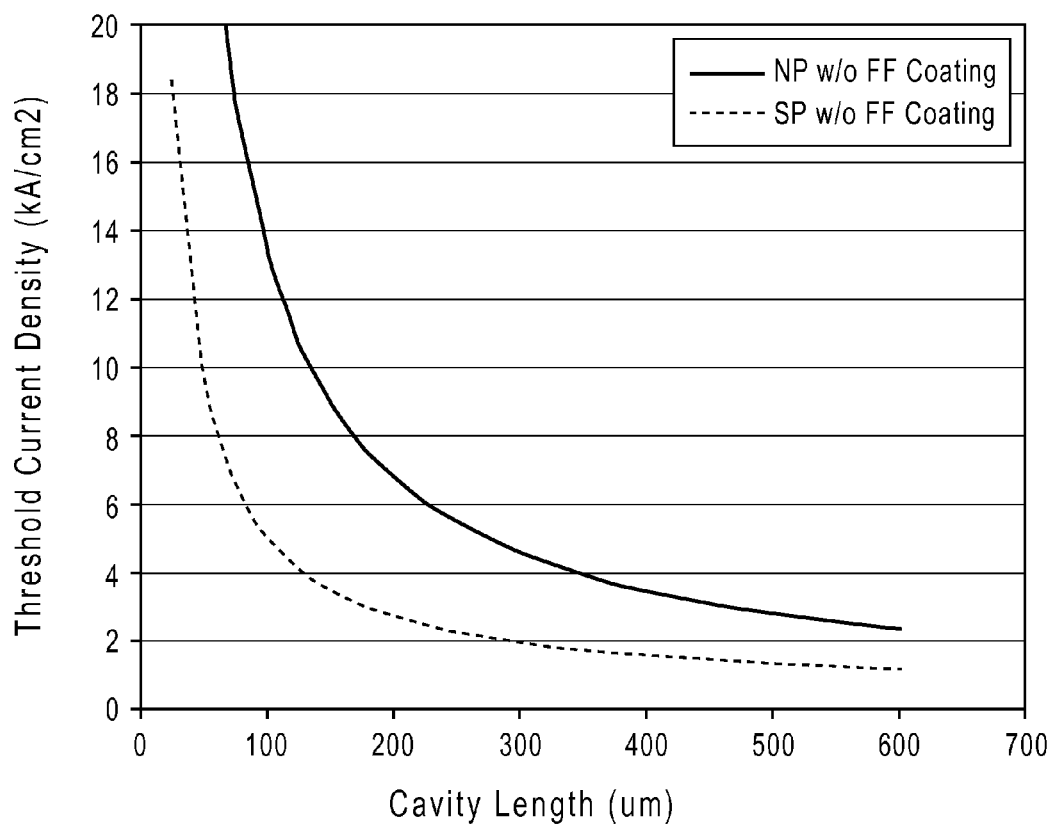
FIG. 5 presents simulated threshold current density versus cavity length for identical laser structures formed on nonpolar m-plane and semipolar (30-3-1) plane assuming no front facet coating.

FIG. 5 presents the simulated threshold current density dependence on laser cavity length for blue LDs fabricated on the nonpolar m-plane (solid) orientation using the experimentally measured differential modal gain of 6.6 cm$^{-1}$/(kA/cm$^2$) versus blue LDs fabricated on the semipolar (30-3-1) (dashed) orientation using the experimentally measured gain of 19.3 cm$^{-1}$/(kA/cm$^2$), where the back facet is coated for 99% reflectivity and the front facet is not coated to modify the reflectivity. Reasonable values of 200 kA/cm$^2$ and 90% were assumed for the transparency current density and internal quantum efficiency, respectively. The simulation shows that the high gain semipolar device can achieve lasing with about 3.5 kA/cm$^2$ threshold current density in a 150 μm long cavity or about 5 kA/cm$^2$ in a 100 μm long cavity. The nonpolar device would require a 9 kA/cm$^2$ threshold current density at a cavity length of 150 μm or about 17 kA/cm$^2$ for a cavity length of 100 μm. A cavity length of 400 μm would be needed to achieve about 3.5 kA/cm$^2$ for the nonpolar device. The low threshold current densities associated with short cavities laser diodes on semipolar proves the viability of such devices.

Figure 6:
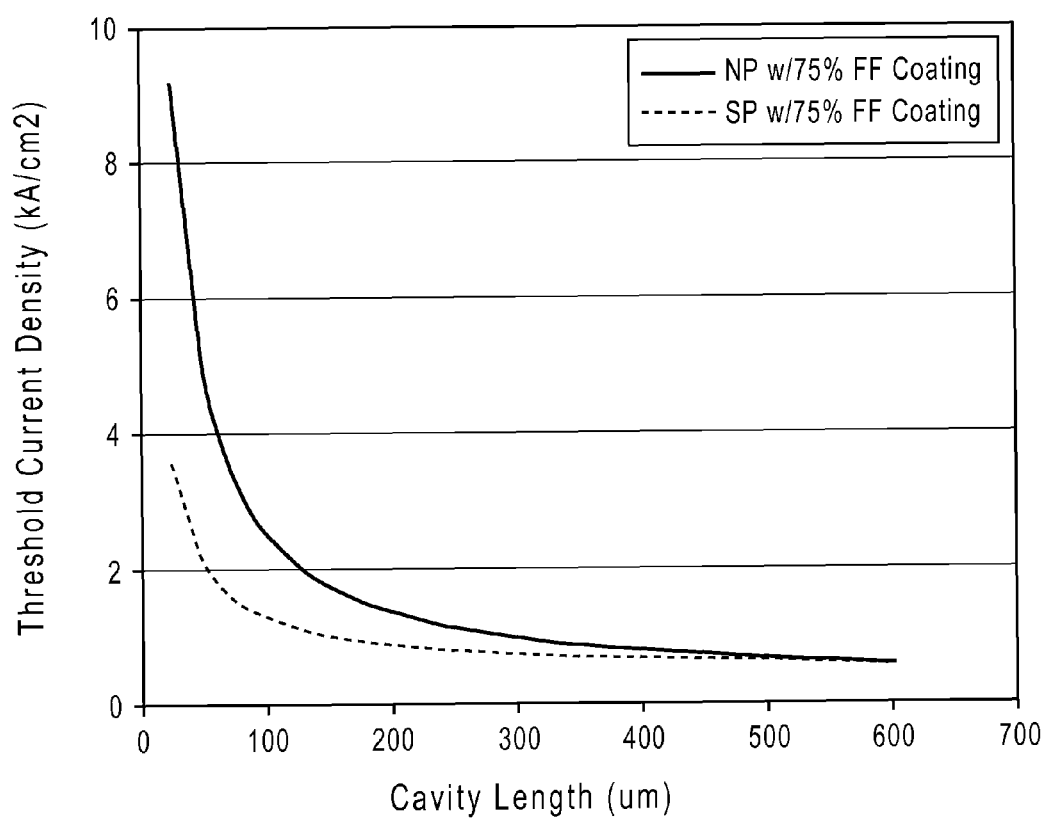
FIG. 6 presents simulated threshold current density versus cavity length for identical laser structures formed on nonpolar m-plane and semipolar (30-3-1) plane assuming a front facet coating with a reflectivity of 75%.

FIG. 6 presents the simulated threshold current density dependence on laser cavity length for blue LDs fabricated on the nonpolar m-plane (solid) orientation using the experimentally measured differential modal gain of 6.6 cm$^{-1}$/(kA/cm$^2$) versus blue LDs fabricated on the semipolar (30-3-1) (dashed) orientation using the experimentally measured gain of 19.3 cm$^{-1}$/(kA/cm$^2$), where the back facet is coated with 99% reflectivity and the front facet is coated for a about 75% reflectivity. Reasonable values of 200 kA/cm$^2$ and 90% were assumed for the transparency current density and internal quantum efficiency, respectively. The simulation shows that the high gain semipolar device can achieve lasing with about 3.5 kA/cm$^2$ threshold current density in a 50 μm long cavity and about 1 kA/cm$^2$ in a 100 μm long cavity whereas the nonpolar device would require 9 kA/cm$^2$ threshold current density at a cavity length of 50 μm. For the nonpolar device a cavity length of 200 μm would be needed to achieve about 1 kA/cm$^2$.

In an example, the short cavity provides a highly efficient laser device that has higher dies/wafer. Additionally, the short cavity is often easier to manufacture, and has a smaller form factor, which allows for integration into a multitude of applications. Further benefits of the present device can be found throughout the present specification.

It was discovered that laser diodes fabricated on certain semipolar orientations of bulk gallium and nitrogen containing substrates such as (30-3-1), a (30-31), a (20-2-1), and a (20-21) can have novel properties. Such semipolar planes can exhibit birefringence even when the laser cavities are aligned in the direction of highest gain, which is in the projection of the c-direction. This birefringence leads to a rotation of the polarization as the optical mode propagates along the cavity. For the family of semipolar planes with orientations that are rotated between the c-plane and the m-plane and the laser diode stripe aligned in the projection of the c-direction, this result is somewhat unexpected since based on crystal symmetry alone there should be no birefringence in these planes for cavities oriented along the projection of the c-direction (Scheibenzuber et al., Physical Review B, 80, 115320, 2009).

Figure 7:
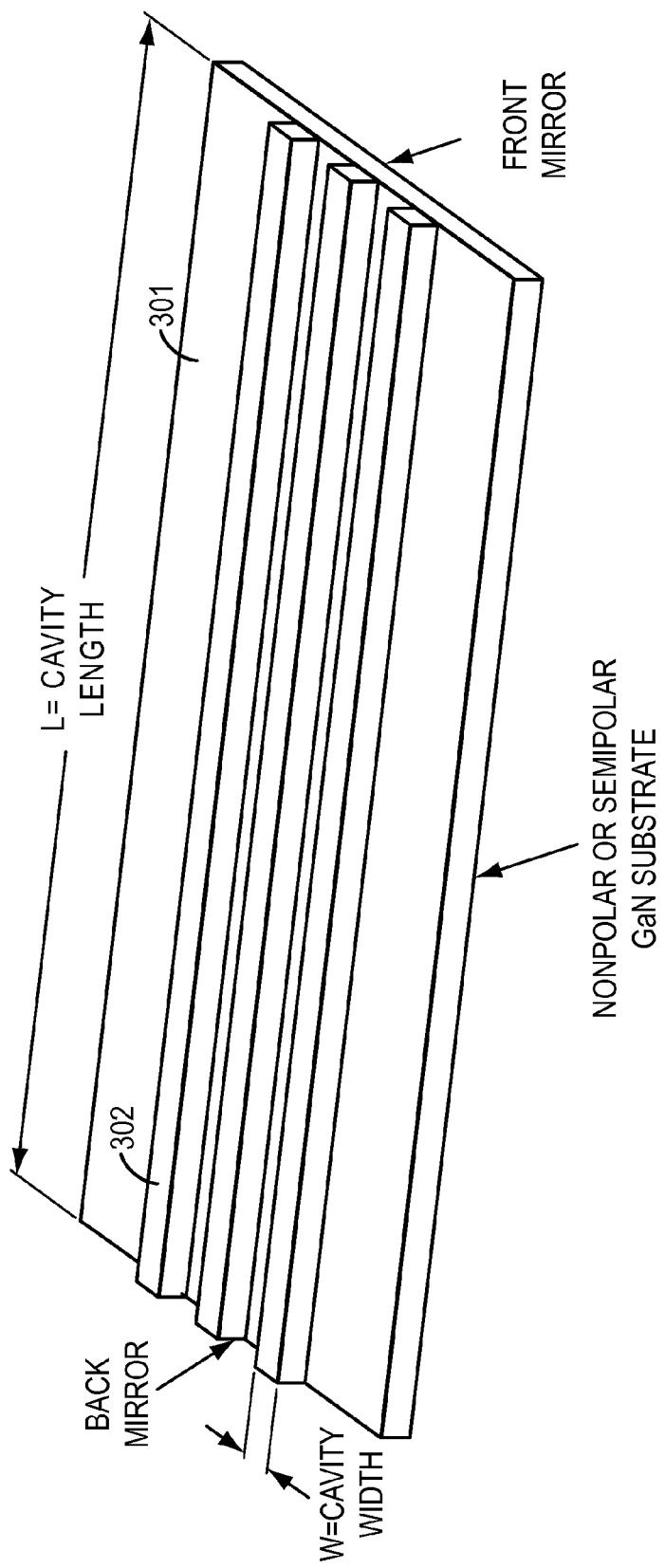
FIG. 7 shows a schematic image of a multi-stripe laser chip depicting the cavity width and length.
Figure 8:
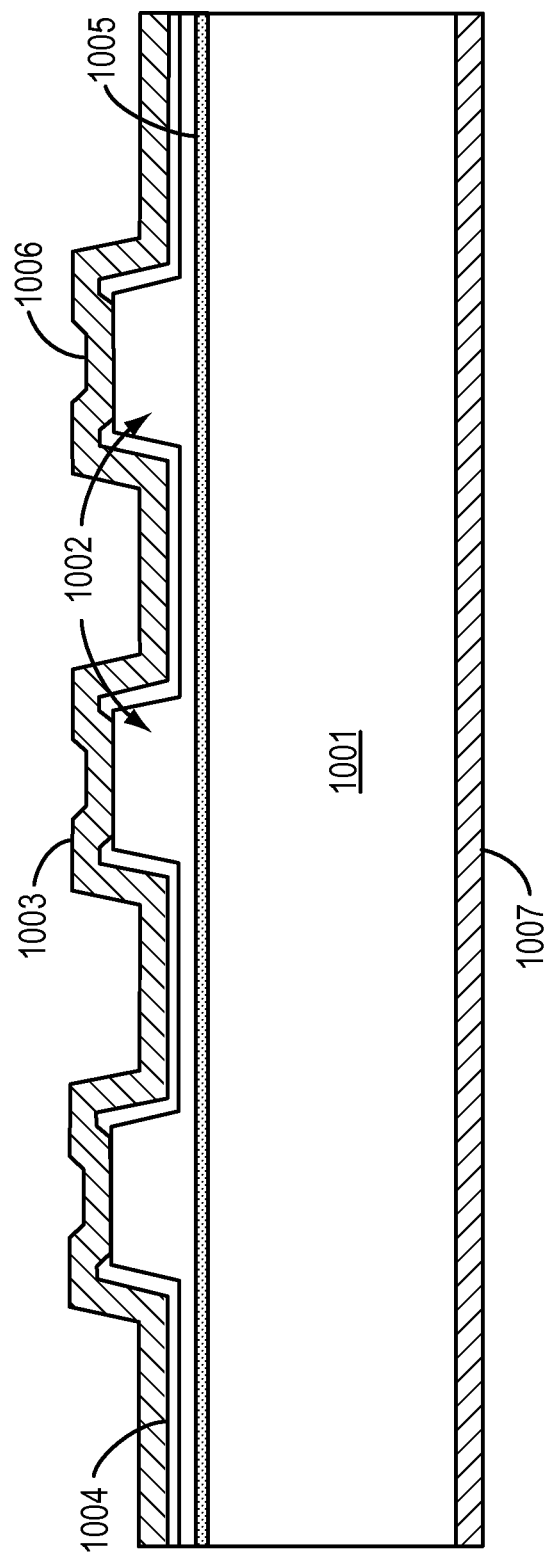
FIG. 8 is a schematic diagram of a cross-section of a multi-stripe laser configuration.

Certain embodiments provide methods to achieve high-performance, high-power laser diodes fabricated on semipolar orientations. Certain embodiments comprise an array of narrow laser diode cavities such that each laser can only support a single lateral mode. In this multi-stripe embodiment, n laser stripes are defined under an electrode where all of the n laser stripes are operating in the single mode. For example, if each single lateral mode laser stripe can generate 100 mW of power an array of n=10 stripes would form a 1 W laser device. In this example, if each single emitter width is 1.5 μm the total combined emitter width would be 15 μm, reducing the optical density at the facet by 10 times and reducing the operating current density by 10 times, while simultaneously confining each stripe to the single mode for low internal loss. FIG. 7 shows a schematic image of a multi-stripe laser chip depicting the cavity width and length including laser stripes 302 on a nonpolar or semipolar GaN substrate 301. Each laser stripe is characterized by a cavity length L, a cavity width w, and front and back mirror facets. In certain embodiments, the multi-stripe laser shown in FIG. 7 makes use of multiple stripes supporting only single modes under a common electrode such that each stripe contribute to overall output power of the laser device and the total output area is increased while maintaining single mode operation in each stripe. FIG. 8 is a schematic diagram of a cross-section of a multi-stripe laser configuration. Prior art exists on multi stripe laser arrays to prevent filamenting, reduce the thermal density, and for improved control over the far field pattern. However, deploying this technique to achieve larger total emitter width and overcome increased loss associated with higher order lateral modes enables one to leverage the desirable properties such as high gain from such semipolar orientations.

As shown in FIG. 8, the multiple cavity members 1002 are provided over the substrate 1001. A layer of electrode 1003 is provided over the cavity member 1002 and the exposed region of the substrate 1001. For example, the electrode 1003 comprises p-type electrode. For example, a dielectric layer 1004, which comprises substantially dielectric material, is provided between the electrode 1003 and the substrate 1001. The substrate 1001 comprises an active region 1005. For example, the active region 1005 comprises one or more quantum wells. In certain embodiments, the cavity member 1002 includes a via 1006. At the bottom side of the substrate 1001, the laser device comprises an electrode 1007. For example, the electrode 1007 comprises an n-type contact. In various embodiments, the laser device is electrically coupled to a power source through the electrodes 1003 and 1007.

It is to be appreciated that the shaped design as illustrated in FIG. 7 and FIG. 8 can be used in various power settings.

More specifically, the laser device in FIG. 7 can operate with continuous wave output power of greater than 0.1 W, greater than 0.5 W, greater than 1 W, greater than 2 W, greater than 5 W, greater than 10 W, or other power settings. Similarly, the operating voltage can be less than 7V, less than 6.5V, less than 6V, less than 5.5V, less than 5V, less than 4.5V, or other voltages. As one of the benefit of the shaped design, the laser device can provide a peak wall plug efficiency of at least 15%, at least 20%, at least 25%, at least 30%, at least 35%, at least 40%, or even higher. Depending on the specific application, the spectral width can be greater than 0.3 nm, greater than 0.5 nm, greater 1 nm, greater than 2 nm, greater 3 nm, or other spectral width. As an example, spectral width refers to a range of frequencies or wavelengths emitted by a transmitter and surrounding the center frequency or wavelength at a power level equal to half the maximum power level. Typically, relatively wide spectral width (e.g., greater than 1 nm) is preferred in applications such as pico projector systems.

A second example is for increased efficiency in very low optical output power applications of less than 25 mW where the conventional edge emitting laser diode lengths of 450 μm to 600 μm are not optimal. In such low power applications high reflectivity coatings are often applied to the front facet to reduce the mirror loss of the cavity and hence reduce the threshold current density such that the laser will achieve threshold at a lower current. This high reflectivity coating for reduced threshold current has the undesired property of reducing the slope efficiency of the laser diode such that the amount of unit optical output power per unit of electrical input current is reduced. The result is low optical output power for a given operating current. Short cavity lengths combined with the high gain of gallium and nitrogen containing semipolar laser diodes breaks this trade-off by allowing for both low threshold current and high slope efficiency. The result is a high efficiency laser diode operating in this low power regime. With the high modal gain characteristic of semipolar laser diodes and the appropriate selection of front facet mirror coating reflectivity, cavity lengths of less than 50 μm, less than 100 μm, or less than 200 μm can be accessed with viable threshold current density of less than 5 kA/cm² or less than 3 kA/cm² with high slope efficiencies of greater than 0.6 W/A, greater than 0.9 W/A, greater than 1.2 W/A, or even greater than 1.5 W/A can be achieved.

A third benefit of this invention is the small form factor of the chip resulting from the short cavity. That is, by reducing the cavity length from the 500 m to 600 μm range to the 50 m to 100 μm range the footprint of the chip can be reduced by 5- to 12-times. This can enable the capability to pack a high density of individual laser diodes into a small area or volume. Further, such tiny laser diodes can spawn the adoption of new ultra-compact package designs that are much smaller than the conventional TO56 or TO38 can-type packages. As a result, such tiny packaged laser diodes can be integrated into small objects previously not accessible such as pens/pencils, small key chains, cell phone cases, etc.

As used herein, the term GaN substrate is associated with Group III-nitride based materials including GaN. InGaN, AlGaN, or other Group III containing alloys or compositions that are used as starting materials. Such starting materials include polar GaN substrates (i.e., substrate where the largest area surface is nominally an (h k l) plane wherein h=k=0, and 1 is non-zero), non-polar GaN substrates (i.e., substrate material where the largest area surface is oriented at an angle ranging from about 80 degrees to 100 degrees from the polar orientation described above towards an (h k l) plane wherein l=0, and at least one of h and k is non-zero) or semipolar GaN substrates (i.e., substrate material where the largest area surface is oriented at an angle ranging from about +0.1 degrees to 80 degrees or 110-179.9 degrees from the polar orientation described above towards an (h k l) plane wherein l=0, and at least one of h and k is non-zero).

In an example, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Publication No. 2010/0302464, which is incorporated by reference herein.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed on May 27, 2010, which is incorporated by reference herein.

While the above is a full description of the specific embodiments, various modifications, alternative constructions and equivalents may be used. As an example, the packaged device can include any combination of elements described above, as well as outside of the present specification.

As used herein, the term "substrate" can mean the bulk substrate or can include overlying growth structures such as a gallium and nitrogen containing epitaxial region, or functional regions such as n-type GaN, combinations, and the like. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

What is claimed is:

1. A laser device comprising:
a gallium and nitrogen containing material having a semipolar surface configured on an offcut orientation to one of either a (60-6-1) plane, a (60-61) plane, a (50-5-1) plane, a (50-51) plane, a (40-4-1) plane, (40-41) plane, a (30-3-1) plane, a (30-31) plane, a (20-2-1) plane, a (20-21) plane, a (30-3-2), or a (30-32) plane;
a laser stripe region formed overlying a portion of the semipolar surface, the laser stripe region being characterized by a cavity orientation substantially parallel to the projection of the c-direction, the laser stripe region having a first end and a second end;
the laser stripe region characterized by a length less than 300 μm;
a first facet provided on the first end of the laser stripe region;
a second facet provided on the second end of the laser stripe region;
an n-type cladding region overlying the semipolar surface;

an active region comprising at least one active layer region overlying the n-type cladding region, the active region comprising a quantum well region or a double heterostructure region; and a p-type cladding region overlying the active region;

wherein the laser stripe region is characterized by a width configured to emit a laser beam having a selected ratio of a first polarization state and a second polarization state, the width configured to emit the laser beam operable in a single lateral mode for an internal loss of less than 8 cm$^{-1}$.

2. The laser device of claim 1, wherein the laser stripe region is characterized by a length less than 200 μm, or wherein the laser stripe region is characterized by a length of less than 100 μm, or wherein the laser stripe region is characterized by a length less than 50 μm; and wherein the n-type cladding region is substantially free from aluminum bearing materials.

3. The laser device of claim 1, wherein the laser device is configured to emit electromagnetic radiation in a wavelength range selected from a 400 nm to 435 nm range, a 435 nm to 480 nm range, a 480 nm to 505 nm range, and a 505 nm to 550 nm range.

4. The laser device of claim 1, wherein the first facet and the second facet are formed by a scribing and breaking process or wherein the first facet and the second facet are formed by an etching process.

5. The laser device of claim 4, wherein the etching process is selected from reactive ion etching (RIE), inductively coupled plasma (ICP) etching, and chemical assisted ion beam etching (CAIBE).

6. The laser device of claim 1, wherein the laser beam is configured as a cross-polarized emission; wherein the first polarization state is a primary state and the second polarization state is a secondary state such that the power emitted in the second polarization state is at least 10% greater than, at least 20% greater than, at least 30% greater than, or at least 40% greater than the power emitted in the first polarization state.

7. The laser device of claim 1, wherein the laser beam is configured to emit in a polarized state wherein the first polarization state is a primary state and the second polarization state is a secondary state such that the power emitted in the second polarization state is at less than 10%, less than 5%, less than 1%, or less than 0.1% of the power emitted in the first polarization state.

8. The laser device of claim 1, wherein the laser device is configured for a pointer application, a display application, a medical application, a biological application, a manufacturing application, a projector application, a visual application, a communication application, or a metrology application.

9. The laser device of claim 1, wherein the laser stripe region is one of a plurality of laser stripes, wherein each of the plurality of laser stripes is configured in a parallel arrangement and is configured to emit in a polarized state wherein the first polarization state is a primary state and the second polarization state is a secondary state such that the power emitted in the second polarization state is less than 10%, less than 5%, less than 1%, or less than 0.1% the power emitted in the first polarization state.

10. The laser device of claim 1, wherein the offcut of the semipolar orientation is between +/−4 degrees toward a c-plane, between +/−10 degrees toward an a-plane, or between +/−4 degrees toward a c-plane and between +/−10 degrees toward an a-plane.

11. The laser device of claim 1, wherein the laser stripe region is configured to emit a linearly polarized laser beam, a circularly polarized laser beam, or an elliptically polarized laser beam.

12. A laser device comprising:

a gallium and nitrogen containing material having a semipolar surface configured on an offcut orientation to one of either a (30-3-1) plane, a (30-31) plane, a (20-2-1) plane, a (20-21) plane, a (30-3-2), or a (30-32) plane;

an array of N single lateral mode laser stripes formed overlying the semipolar surface, wherein:

each of the laser stripes is characterized by a cavity orientation substantially parallel to the projection of a c-direction, each of the laser stripes having a length less than 300 μm;

each of the laser stripes is characterized by a width ranging from about 0.5 μm to about 2.5 μm;

each of the laser stripes is configured to operate in a single lateral mode;

each of the laser stripes is configured to emit a laser beam characterized by a first polarization state and a second polarization state, wherein the first polarization state is orthogonal to the second polarization state; and the laser device is configured to emit a plurality of laser beams, each of the plurality of laser beams characterized by a primary polarization state and a secondary polarization state, wherein a power emitted in the second polarization state is at less than 15% of a power emitted in the first polarization state, and the laser device is characterized by an internal loss of less than 9 cm$^{-1}$ and a polarization ratio of at least 90% or at least 95% between the power emitted in the first polarization state and the power emitted in the second polarization state.

13. The laser device of claim 12, wherein the laser stripe region is characterized by a length less than 200 μm, less than 100 μm, or less than 50 μm.

14. The laser device of claim 12, wherein each of the laser stripe regions has a first end having a first facet and a second end having a second facet, and wherein the first facet and the second facet are formed by a scribing and breaking process.

15. The laser device of claim 12, wherein each of the laser stripe regions has a first end having a first facet and a second end having a second facet wherein the first facet and the second facet are formed by an etching process; wherein the etching process is selected from reactive ion etching (RIE), inductively coupled plasma (ICP) etching, and chemical assisted ion beam etching (CAIBE).

16. The laser device of claim 12, wherein the offcut of the semipolar orientation is between +/−5 degrees toward a c-plane, between +/−10 degrees toward an a-plane, or between +/−5 degrees toward a c-plane and between +/−10 degrees toward an a-plane.

17. The laser device of claim 12, wherein the laser device is configured to emit in a polarized state wherein the power emitted in the second polarization state is less than 10%, less than 5%, less than 1%, less than 0.1%, or less than 0.01%, the power emitted in the first polarization state.

18. The laser device of claim 12, wherein the width ranging from 1.3 μm to 2 μm and is configured to maintain a single lateral mode operation; and wherein N ranges from 2 to 20.

19. The laser device of claim 12, wherein each pair of laser stripes is laterally spaced by about 3 μm to about 200 μm; and further comprising a common p-type electrode region coupling the array of N laser stripes; and a common n-type electrode coupling the array of N laser stripes.

20. The laser device of claim 12, further comprising an optical coupling device to optically couple an emission from each of the N laser stripes to form a single emission.

21. The laser device of claim 12, further comprising a total output power of at least 100 mW and characterized by a single lateral mode of operation of each of the N laser stripes.

22. The laser device of claim 12, further comprising a total output power of at least 200 mW and characterized by a single lateral mode of operation of each of the N laser stripes.

23. The laser device of claim 12, further comprising a total output power of at least 500 mW and characterized by a single lateral mode of operation of each of the N laser stripes.

24. The laser device of claim 12, wherein the laser device is operable to emit electromagnetic radiation in a wavelength range selected from a 400 nm to 435 nm range, a 435 nm to 480 nm range, a 480 nm to 505 nm range, and a 505 nm to 550 nm range.

25. The laser device of claim 12, wherein each of the laser stripe regions is configured to emit a linearly polarized laser beam, a circularly polarized laser beam, an elliptically polarized laser beam, or a combination of any of the foregoing.

26. A laser device comprising:
a gallium and nitrogen containing material having a semipolar surface configured on an offcut orientation to one of either a (60-6-1) plane, a (60-61) plane, a (50-5-1) plane, a (50-51), a (40-4-1) plane, a (40-41) plane, a (30-3-1) plane, a (30-31) plane, a (20-2-1) plane, a (20-21) plane, a (30-3-2) plane, or a (30-32) plane;
a laser stripe region formed overlying a portion of the semipolar surface, the laser stripe region being characterized by a cavity orientation substantially parallel to the projection of the c-direction, the laser stripe region having a first end and a second end;
a first facet provided on the first end of the laser stripe region;
a second facet provided on the second end of the laser stripe region;
an n-type cladding region overlying the semipolar surface;
an active region comprising at least one active layer region overlying the n-type cladding region; the active region comprising a quantum well region or a double heterostructure region; and
a p-type cladding region overlying the active region;
a width characterizing the laser stripe region configured to emit a laser beam having a first polarization state and a second polarization state, the first polarization state being orthogonal to the second polarization state and the first polarization state being the primary polarization state, the width configured to emit the laser beam operable in a multi-lateral mode for an internal loss of less than 8 cm$^{-1}$; and
a polarization ratio of the laser beam characterizing a cross-polarized emission such that at least 15% of an emitted power is in the second polarization state.

27. The laser device of claim 26, wherein the offcut of the semipolar orientation is between +/−5 degrees toward a c-plane, between +/−10 degrees towards an a-plane, or between +/−5 degrees toward a c-plane and between +/−10 degrees towards an a-plane; wherein at least 20% of the emission is in the second polarization state or wherein at least 30% of the emission is in the second polarization state or wherein at least 40% of the emission is in the second polarization state.

28. The laser device of claim 27, wherein the laser device is configured to emit electromagnetic radiation in a wavelength range selected from a 400 nm to 435 nm range, a 435 nm to 480 nm range, a 480 nm to 505 nm range, and a 505 nm to 550 nm range.

29. The laser device of claim 27, wherein the laser stripe region is configured to emit a linearly polarized laser beam, a circularly polarized laser beam, or an elliptically polarized laser beam.

30. A method of manufacturing an optical device, the method comprising:
providing a gallium and nitrogen containing semipolar member having a crystalline surface region; the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane; the gallium and nitrogen containing substrate member characterized by a dislocation density of less than $10^7$ cm$^{-2}$;
forming a gallium and nitrogen containing n-type cladding layer overlying the surface region, the n-type cladding layer having a thickness from 300 nm to 6000 nm with an n-type doping level of 1E17 cm$^{-3}$ to 6E18 cm$^{-3}$;
forming an n-side separate confining heterostructure (SCH) waveguiding layer overlying the n-type cladding layer, the n-side SCH waveguide layer comprising gallium, indium, and nitrogen with a molar fraction of InN of between 1% and 12% and having a thickness from 20 nm to 150 nm;
forming an active region overlying the n-side SCH waveguiding layer, the active region comprising at least two quantum wells, the at least two quantum wells comprising InGaN with a thickness of about 2 nm to about 8 nm; the at least two quantum wells separated by barrier regions, the barrier regions comprising gallium and nitrogen with a thickness of about 2.5 nm to about 25 nm;
forming a p-type gallium and nitrogen containing cladding layer overlying the active region, the p-type cladding layer having a thickness from 300 nm to 1000 nm with a p-type doping level of 1E17 cm$^{-3}$ to 5E19 cm$^{-3}$;
forming a p++ gallium and nitrogen containing contact layer overlying the p-type cladding layer, the p++ gallium and nitrogen containing contact layer having a thickness from 10 nm to 120 nm with a p-type doping level of 1E19 cm$^{-3}$ to 1E22 cm$^{-3}$; and
forming a waveguide member overlying the p++ gallium and nitrogen contact layer, the waveguide member aligned substantially in the projection of the c-direction, the waveguide member comprising a first end and a second end, the first end having a first facet and the second end having a second facet, the waveguide member being characterized by a length of less than 300 microns and a width configured to emit a laser beam having a selected ratio of a first polarization state and a second polarization state, the width configured to emit the laser beam operable in a single lateral mode for an internal loss of less than 8 cm$^{-1}$.

31. A method for manufacturing an optical device, the method comprising:
providing a gallium and nitrogen containing semipolar member having a crystalline surface region, the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane, the gallium and nitrogen containing semipolar member being characterized by a dislocation density of less than $10^7$ cm$^{-2}$;

forming an n-type cladding layer comprising a first ternary AlGaN alloy or a first quaternary AlInGaN alloy, the first alloy comprising at least an aluminum bearing species, a gallium bearing species, and a nitrogen bearing species overlying the surface region, the n-type cladding layer having a thickness from 100 nm to 6000 nm with an n-type doping level of 5E16 cm$^{-3}$ to 6E18 cm$^{-3}$;

forming an n-side separate confining heterostructure (SCH) waveguiding layer overlying the n-type cladding layer, the n-side SCH waveguiding layer comprising InGaN with a molar fraction of InN of between 1% and 10% and having a thickness from 30 nm to 150 nm;

forming a multiple quantum well active region overlying the n-side SCH waveguiding layer, the multiple quantum well active region comprising two to five, 2 nm to 8 nm thick, InGaN quantum wells separated by 3 nm to 20 nm thick gallium and nitrogen containing barrier layers;

forming a p-type cladding layer comprising a second ternary AlGaN alloy or quaternary AlInGaN alloy overlying the multiple quantum well active region, the p-type cladding layer having a thickness from 250 nm to 1,000 nm and comprising a p-type doping species including magnesium at a concentration of 1E17 cm$^{-3}$ to 4E19 cm$^{-3}$;

forming a p++ gallium and nitrogen containing contact layer overlying the p-type cladding layer, the p++ gallium and nitrogen containing contact layer having a thickness from 10 nm to 140 nm and comprising a p-type doping species including magnesium at a concentration of 1E19 cm$^{-3}$ to 1E22 cm$^{-3}$; and forming a waveguide member, the waveguide member being aligned substantially in the projection of the c-direction, the waveguide member comprising of a first end and a second end, the first end comprising a first facet, the second end comprising a second facet, the waveguide member provided between the first facet and the second facet and being characterized by a length of less than 300 microns and a width configured to emit a laser beam having a selected ratio of a first polarization state and a second polarization state, the width configured to emit the laser beam operable in a single lateral mode for an internal loss of less than 8 cm$^{-1}$, the waveguide member having a first edge region formed on a first side of the waveguide member, the first edge region having a first etched surface formed on the first edge region, the waveguide member having a second edge region formed on a second side of the waveguide member, the second edge region having a second etched surface formed on the second edge region.

32. A method of manufacturing an optical device, the method comprising:

providing a gallium and nitrogen containing semipolar member having a crystalline surface region; the semipolar surface being configured on an offcut orientation to one of either a (60-6-1) plane, a (60-61) plane, a (50-5-1) plane, a (50-51) plane, a (40-4-1) plane, a (40-41) plane, a (30-3-1) plane, a (30-31) plane, a (20-2-1) plane, a (20-21) plane, a (30-3-2) plane, or a (30-32) plane; the gallium and nitrogen containing semipolar member characterized by a dislocation density of less than $10^7$ cm$^{-2}$;

forming a gallium and nitrogen containing n-type cladding layer overlying the surface region, the n-type cladding layer having a thickness from 300 nm to 6000 nm with an n-type doping level of 1E17 cm$^{-3}$ to 6E18 cm$^{-3}$, the n-type cladding layer being substantially free from an aluminum bearing material;

forming an n-side separate confining heterostructure (SCH) waveguiding layer overlying the n-type cladding layer, the n-side SCH waveguiding layer comprising gallium, indium, and nitrogen with a molar fraction of InN of between 1% and 12% and having a thickness from 20 nm to 150 nm;

forming an active region overlying the n-side SCH waveguiding layer, the active region comprising at least two quantum well regions, the at least two quantum wells comprising InGaN with a thickness of about 2 nm to about 8 nm; the at least two quantum wells separated by barrier regions, the barrier regions comprising least gallium and nitrogen with a thickness of about 2.5 nm to about 25 nm;

forming a p-type gallium and nitrogen containing cladding layer overlying the active region, the p-type cladding layer having a thickness from 300 nm to 1000 nm with a p-type doping level of 1E17 cm$^{-3}$ to 5E19 cm$^{-3}$;

forming a p++ gallium and nitrogen containing contact layer overlying the p-type gallium and nitrogen containing cladding layer, the p++ gallium and nitrogen containing contact layer having a thickness from 10 nm to 120 nm with a p-type doping level of 1E19 cm$^{-3}$ to 1E22 cm$^{-3}$; and forming a waveguide member, the waveguide member aligned substantially in the projection of the c-direction, the waveguide member comprising a first end and a second end, the first end having a first facet and the second end having a second facet, the waveguide member being characterized by a length of less than 300 microns and a width configured to emit a laser beam having a selected ratio of a first polarization state and a second polarization state, the width configured to emit the laser beam operable in a single lateral mode for an internal loss of less than 8 cm$^{-1}$.

* * * * *